United States Patent
US 10,651,122 B1
Bao et al.
(45) Date of Patent: May 12, 2020

(54) INTEGRATED CIRCUIT (IC) INTERCONNECT STRUCTURE HAVING A METAL LAYER WITH ASYMMETRIC METAL LINE-DIELECTRIC STRUCTURES SUPPORTING SELF-ALIGNED VERTICAL INTERCONNECT ACCESSES (VIAS)

(71) Applicant: QUALCOMM Incorporated, San Diego, CA (US)

(72) Inventors: Junjing Bao, San Diego, CA (US); Giridhar Nallapati, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/278,539

(22) Filed: Feb. 18, 2019

(51) Int. Cl.
*H01L 23/522* (2006.01)
*H01L 21/768* (2006.01)
*H01L 23/528* (2006.01)

(52) U.S. Cl.
CPC ...... *H01L 23/5226* (2013.01); *H01L 21/7682* (2013.01); *H01L 21/76802* (2013.01); *H01L 21/76831* (2013.01); *H01L 21/76837* (2013.01); *H01L 21/76897* (2013.01); *H01L 23/5283* (2013.01)

(58) Field of Classification Search
CPC ............ H01L 23/5226; H01L 23/5283; H01L 21/76837; H01L 21/7682; H01L 21/76897; H01L 21/76802; H01L 21/76831
See application file for complete search history.

(56) References Cited

U.S. PATENT DOCUMENTS

2017/0278740 A1* 9/2017 Briggs .............. H01L 21/76879

OTHER PUBLICATIONS

Borah, D. et al., "Nanopatterning via Self-Assembly of a Lamellar-Forming Polystyrene-block-Poly(dimethylsiloxane) Diblock Copolymer on Topographical Substrates Fabricated by Nanoimprint Lithography," Nanomaterials, vol. 8, No. 31, Jan. 9, 2018, MDPI, 11 pages.
Jeong, S. et al., "Directed self-assembly of block copolymers for next generation nanolithography," Materials Today, vol. 16, No. 12, Dec. 2013, Elsevier Ltd., pp. 468-476.
(Continued)

*Primary Examiner* — Kyoung Lee
(74) *Attorney, Agent, or Firm* — W&T/Qualcomm

(57) ABSTRACT

An integrated circuit (IC) interconnect structure may include a metal layer with asymmetric metal line-dielectric structures supporting fully self-aligned vertical interconnect accesses (vias). The interconnect structure includes metal lines spaced at a metal line pitch and dielectric structures disposed between adjacent metal lines. The width of the metal lines is asymmetric to the width of dielectric structures, providing an asymmetric width relationship that allows a metal line to have a greater cross-sectional area for reducing electrical resistance without having to increase metal line pitch. The via pattern is self-aligned to an upper metal opening at the top and an underlayer metal recess opening at the bottom, allowing the maximum contact area to reduce via resistance. To reduce capacitive coupling between adjacent metal lines, the adjacent interconnect structures include a plurality of gaps formed in a dielectric material of the dielectric structure.

30 Claims, 13 Drawing Sheets

(56) References Cited

OTHER PUBLICATIONS

Murdoch, G. et al., "Feasibility Study of Fully Self Aligned Vias for 5nm Node BEOL," 2017 IEEE Internatinal Inerconnect Technology Conference (IITC), May 16-18, 2017, Hsinchu, Taiwan, IEEE, 3 pages.
Noguchi, J. et al., "Reliability of Air-Gap Cu Interconnect and Approach to Selective W. Sealing using 90nm Node Technology," Proceedings of the IEEE 2004 International Interconnect Technology Conference, Jun. 9, 2004, Burlingame, CA, IEEE, pp. 81-83.
Priyadarshini, D. et al., "Advanced Metal and Dielectric Barrier Cap Films for Cu Low k Interconnects," IEEE International Interconnect Technology Conference, May 20-23, 2014, San Jose, CA, IEEE, pp. 185-187.

\* cited by examiner

INTEGRATED CIRCUIT (IC) INTERCONNECT STRUCTURE HAVING A METAL LAYER WITH ASYMMETRIC METAL LINE-DIELECTRIC STRUCTURES SUPPORTING SELF-ALIGNED VERTICAL INTERCONNECT ACCESSES (VIAS)

BACKGROUND

I. Field of the Disclosure

The technology of the disclosure relates generally to metal interconnect structures formed in integrated circuits (ICs), and more particularly to forming vertical interconnect accesses (vias) in metal interconnect structures to provide interconnections between metal lines in the metal interconnect structures.

II. Background

Current semiconductor fabrication of integrated circuits (ICs) may include front-end-of-line (FEOL), middle-of-line (MOL), and/or back-end-of-line (BEOL) processes. Semiconductor devices are created by the FEOL and MOL processes. The BEOL processes may include formation of gate contacts, interconnection among differing layers of the ICs, and a series of wafer processing steps for interconnecting the semiconductor devices created during the FEOL and MOL processes. Conventional BEOL processes in semiconductor fabrication employ metal (i.e., copper (Cu)) interconnect structures ("metal interconnects") separated by dielectric structures having low relative permittivity (i.e., low k value) to reduce negative effects, such as signal delay, cross talk, and power dissipation, caused by capacitive coupling between adjacent metal interconnects. These metal interconnects can be formed in a dual damascene process, and comprise horizontal metal line structures and vertical interconnect accesses (vias). The metal interconnects distribute signals within a given interconnect level, which is also referred to as a metal level or metal layer. Vias are interconnects that transmit signals between adjacent metal layers. As the dimensions of semiconductor device structures formed in the FEOL processes continue to decrease, so do the dimensions of the metal interconnects, including metal line pitch and cross-sectional area. As a cross-sectional area of a metal line structure or via decreases, electrical resistance of the metal interconnect increases. As a metal line pitch decreases, a separation distance between adjacent interconnects decreases, which can increase capacitive coupling between adjacent metal interconnects. Consequently, the severity of negative effects due to capacitive coupling between the adjacent metal interconnects increases.

In this regard, FIG. 1A illustrates a top view of a conventional interconnect structure 100 that can be provided in a semiconductor die 102. FIG. 1B illustrates a cross-sectional side view of the interconnect structure 100 in FIG. 1A along an $A_1$-$A_1'$ line. In the interconnect structure 100, a via $V_X$ is formed to provide an interconnection between metal line $M_{X+1}$ in metal layer $ML_{X+1}$ and metal line $M_X$ in metal layer $ML_X$. The notation 'X+1' denotes that the metal layer $ML_{X+1}$ and metal line $M_{X+1}$ are disposed directly above and adjacent to the metal layer $ML_X$ and metal line $M_X$ in this example. The via $V_X$ may be fabricated using a dual damascene process wherein an inter-layer dielectric (ILD) 104 is first deposited, patterned using photolithography, and etched, and the metal line $M_{X+1}$ and via $V_X$ are formed by metal deposition. Thus, the via $V_X$ is aligned to the metal layer $ML_{X+1}$ of the interconnect structure 100 as part of the fabrication process, as shown in FIGS. 1A and 1B. Due to a variation in the fabrication process, there is a misalignment of the patterning of the ILD 104 causing the via $V_X$ to be offset from the metal line $M_X$. Such offset reduces the contact area between the via $V_X$ and the metal line $M_X$, which increases via resistance of the via $V_X$. The via $V_X$ being offset from the metal line $M_X$ also reduces a distance between the via $V_X$ and the adjacent metal line $M_{X(N)}$, but the ILD 104 isolates the adjacent metal line $M_{X(N)}$ from the via $V_X$ to avoid an electrical short (i.e., a via-metal short).

The metal line $M_X$ and the adjacent metal line $M_{X(N)}$ are spaced apart at a metal line pitch P, with each of the metal lines $M_X$, $M_{X(N)}$ having a width of ½ P and a dielectric structure between the metal lines $M_X$, $M_{X(N)}$ having a width of ½ P. In this regard, the metal lines $M_X$, $M_{X(N)}$ and the dielectric structures of the metal layer $ML_X$ are symmetric. If the metal line pitch P in the semiconductor die 102 in FIGS. 1A and 1B is scaled down in size, such that the distance ½ P between adjacent metal lines $M_X$, $M_{X(N)}$ becomes smaller, the misalignment of the via $V_X$ to the metal line $M_X$ results in an even smaller contact area to the metal line $M_X$, which causes increased resistance in via $V_X$, increasing signal delay between the metal lines $M_X$, $M_{X+1}$. The same misalignment with a scaled down pitch P also results in a shorter via-metal distance S between the via $V_X$ and the adjacent metal line $M_{X(N)}$, such that an electrical short due to a breakdown of the ILD 104 between the via $V_X$ and the adjacent metal line $M_{X(N)}$ is more likely to occur. This may be particularly true for a sub-30 nanometer (nm) metal pitch P of the interconnect structure 100 in FIGS. 1A and 1B. There is a need to continue scaling down the semiconductor die 102 in FIGS. 1A and 1B, without increasing interconnect resistance, capacitive coupling, or the incidence of via-metal shorts.

SUMMARY OF THE DISCLOSURE

An integrated circuit (IC) interconnect structure having a metal layer with asymmetric metal line-dielectric structures supporting self-aligned vertical interconnect accesses (vias) is disclosed. The interconnect structure comprises a plurality of metal layers, each comprising one or more metal lines spaced at a metal line pitch (e.g., center-to-center distance). The metal lines facilitate interconnections between semiconductor devices formed in the IC. The interconnect structure further comprises dielectric structures disposed between adjacent metal lines to prevent metal line shorting. In exemplary aspects disclosed herein, the width of the metal lines is asymmetric to (e.g., greater than) the width of dielectric structures between adjacent metal lines, providing an asymmetric width relationship between the metal line and its adjacent dielectric structure. This allows a metal line to have a greater cross-sectional area for reducing electrical resistance between interconnected devices without having to increase metal line pitch. Reduced electrical resistance in a metal line can result in an overall reduced device resistance, thus increasing interconnected device switching speeds.

However, because a distance between the metal lines is reduced due to their wider, asymmetric widths relative to their adjacent dielectric structures, the capacitive coupling between adjacent metal lines may increase, thereby decreasing device switching speeds and potentially offsetting the positive effect of the reduced resistance of the metal lines. Thus, in additional aspects disclosed herein, the adjacent interconnect structures each include a plurality of gaps (e.g., air gaps) formed in a dielectric material of the dielectric structure to reduce the relative permittivity (i.e., k value) of the dielectric structure, and thereby avoid an increase in the capacitive coupling between adjacent metal lines even though the distance between the metal lines is reduced. Reducing the relative permittivity of the dielectric structures can also reduce via-metal shorts between a self-aligned via interconnecting with a destination metal line (e.g. the interconnection destination of the via in the metal layer) and an adjacent metal line. Further, as an example, a plurality of gaps formed in a dielectric structure, as opposed to a single wider gap, may reduce deformation of a cover layer employed to seal an opening at the top of each gap during fabrication of the interconnect structure.

In this regard, in one aspect, an interconnect structure for an IC is disclosed. The interconnect structure comprises a metal layer comprising a plurality of metal lines spaced apart at a metal line pitch in a first direction, each of the plurality of metal lines having a longitudinal axis extending in a second direction orthogonal to the first direction, and having a metal line width in the first direction. The metal layer further comprises a plurality of dielectric structures disposed between the plurality of metal lines, each of the plurality of dielectric structures disposed between adjacent metal lines and having a width in the first direction less than the metal line width, and each of the plurality of dielectric structures comprising a dielectric material having a plurality of gaps.

In another aspect, a method of forming an interconnect structure for an IC is disclosed. The method comprises forming a metal layer comprising a plurality of metal lines disposed at a metal line pitch, and a plurality of dielectric structures, wherein a width of the plurality of metal lines in a first direction is greater than a distance between adjacent metal lines in the first direction. Each metal line among the plurality of metal lines includes a top surface and each dielectric structure of the plurality of dielectric structures includes a top surface. The method also comprises disposing a protective coating on the top surfaces of the plurality of metal lines. The method further comprises disposing a block copolymer layer on the top surfaces of the plurality of dielectric structures, forming phase separation structures of a first type and a second type in the block copolymer layer, and etching the first type of the phase separation structures between the second type of the phase separation structures to expose portions of the top surfaces of the plurality of dielectric structures. The method further comprises etching dielectric material of the plurality of dielectric structures below the exposed portions of the top surfaces of the plurality of dielectric structures, employing the second type of the phase separation structures as a mask to form slices of the dielectric material separated by gaps.

BRIEF DESCRIPTION OF THE FIGURES

FIGS. 4K-1 and 4K-2 are a top view and a cross-sectional side view, respectively, of another exemplary fabrication stage in the process of FIG. 3 for fabricating the interconnect structure in FIGS. 2A and 2B, in which an upper dielectric layer is disposed on the etch stop layer in the interconnect structure in FIG. 4J;

FIGS. 4L-1 and 4L-2 are a top view and a cross-sectional side view, respectively, of another exemplary fabrication stage in the process of FIG. 3 for fabricating the interconnect structure in FIGS. 2A and 2B, in which the upper dielectric layer is etched to form a via opening and a trench opening in the interconnect structure in FIGS. 4K-1 and 4K-2;

FIGS. 4M-1 and 4M-2 are a top view and a cross-sectional side view, respectively, of another exemplary fabrication stage in the process of FIG. 3 for fabricating the interconnect structure in FIGS. 2A and 2B, in which a diffusion barrier is disposed in the via opening and the trench opening in the upper dielectric layer in the interconnect structure in FIGS. 4L-1 and 4L-2;

FIGS. 4N-1 and 4N-2 are a top view and a cross-sectional side view, respectively, of another exemplary fabrication stage in the process of FIG. 3 for fabricating the interconnect structure in FIGS. 2A and 2B, in which metal is disposed in the via opening and the trench opening to form an upper metal line and self-aligned via coupled to one of the plurality of metal lines in the interconnect structure in FIGS. 4M-1 and 4M-2;

DETAILED DESCRIPTION

Figure 1B:
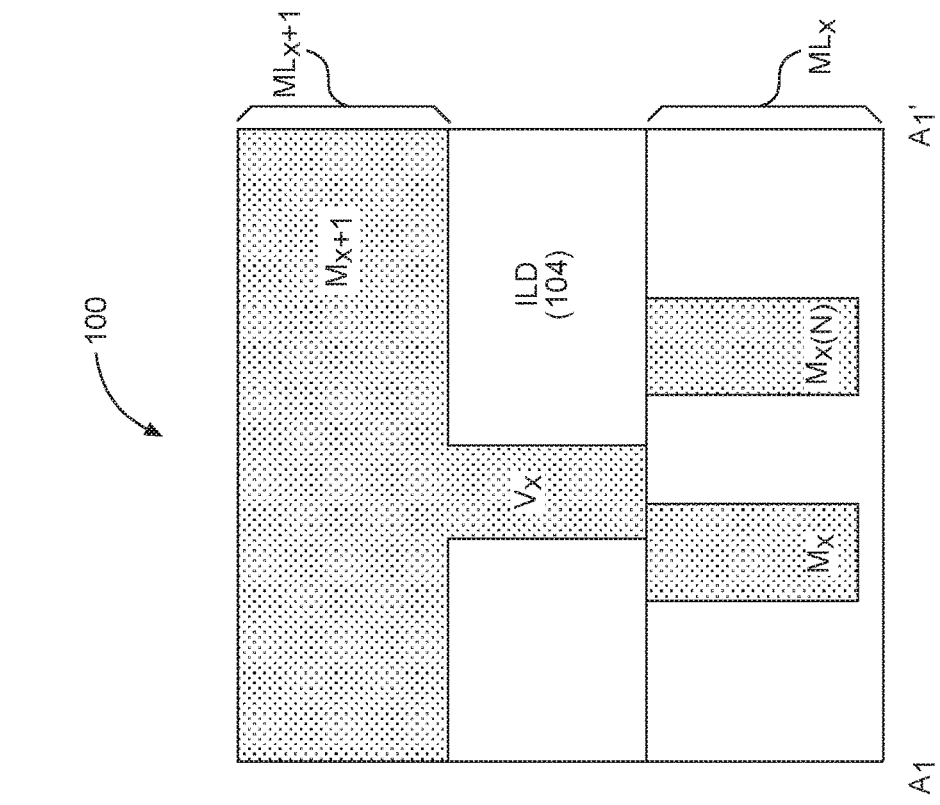
FIGS. 1A and 1B are top and cross-sectional side views, respectively, of an interconnect structure for an integrated circuit (IC) having a misaligned vertical interconnect access (via) interconnecting a metal line in an upper metal layer to a metal line in a lower metal layer.
Figure 1A:
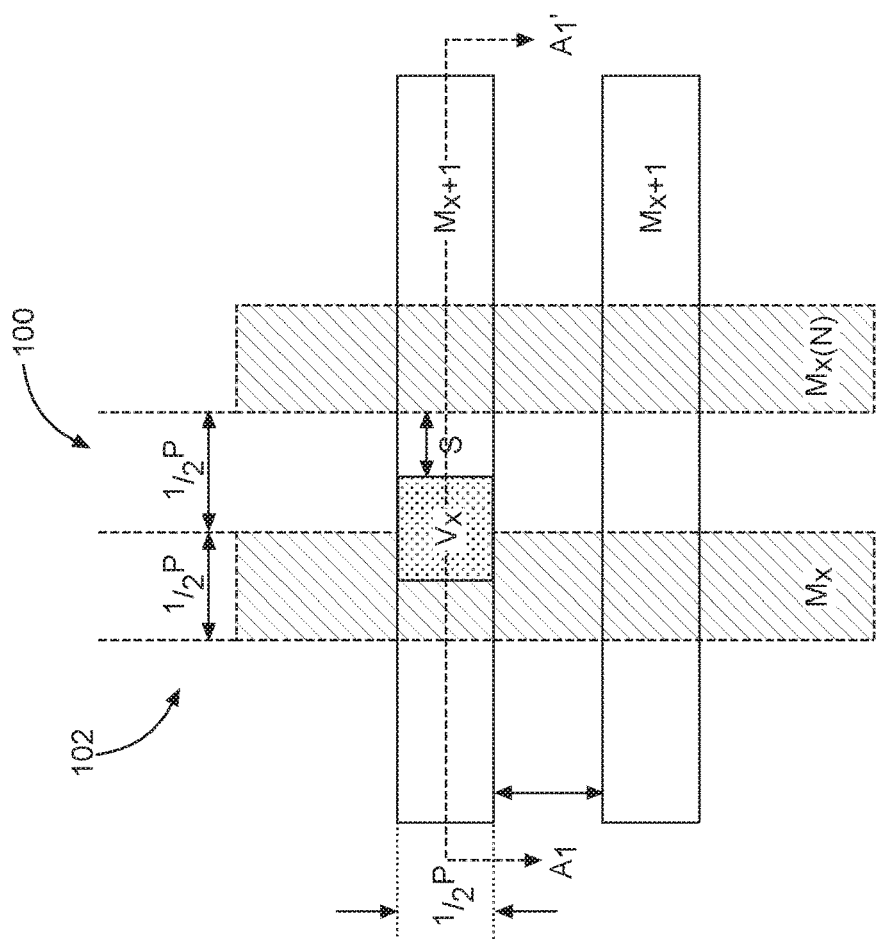

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

An integrated circuit (IC) interconnect structure having a metal layer with asymmetric metal line-dielectric structures supporting self-aligned vertical interconnect accesses (vias) is disclosed. The interconnect structure comprises a plurality of metal layers, each comprising one or more metal lines spaced at a metal line pitch (e.g., center-to-center distance). The metal lines facilitate interconnections between semiconductor devices formed in the IC. The interconnect structure further comprises dielectric structures disposed between adjacent metal lines to prevent metal line shorting. In exemplary aspects disclosed herein, the width of the metal lines is asymmetric to (e.g., greater than) the width of dielectric structures between adjacent metal lines, providing an asymmetric width relationship between the metal line and its adjacent dielectric structure. This allows a metal line to have a greater cross-sectional area for reducing electrical resistance between interconnected devices without having to increase metal line pitch. Reduced electrical resistance in a metal line can result in an overall reduced device resistance, thus increasing interconnected device switching speeds.

However, because a distance between the metal lines is reduced due to their wider, asymmetric widths relative to their adjacent dielectric structures, the capacitive coupling between adjacent metal lines may increase, thereby decreasing device switching speeds and potentially offsetting the positive effect of the reduced resistance of the metal lines. Thus, in additional aspects disclosed herein, the adjacent interconnect structures each include a plurality of gaps (e.g., air gaps) formed in a dielectric material of the dielectric structure to reduce the relative permittivity (i.e., k value) of the dielectric structure, and thereby avoid an increase in the capacitive coupling between adjacent metal lines, even though the distance between the metal lines is reduced. A gap reducing the relative permittivity of the dielectric structures can also reduce via-metal shorts between a self-aligned via interconnecting with a destination metal line (e.g. the interconnection destination of the via in the metal layer) and an adjacent metal line. Further, as an example, a plurality of gaps formed in a dielectric structure, as opposed to a single wider gap, may reduce deformation of a cover layer employed to seal an opening at the top of each gap during fabrication of the interconnect structure.

Figure 2A:
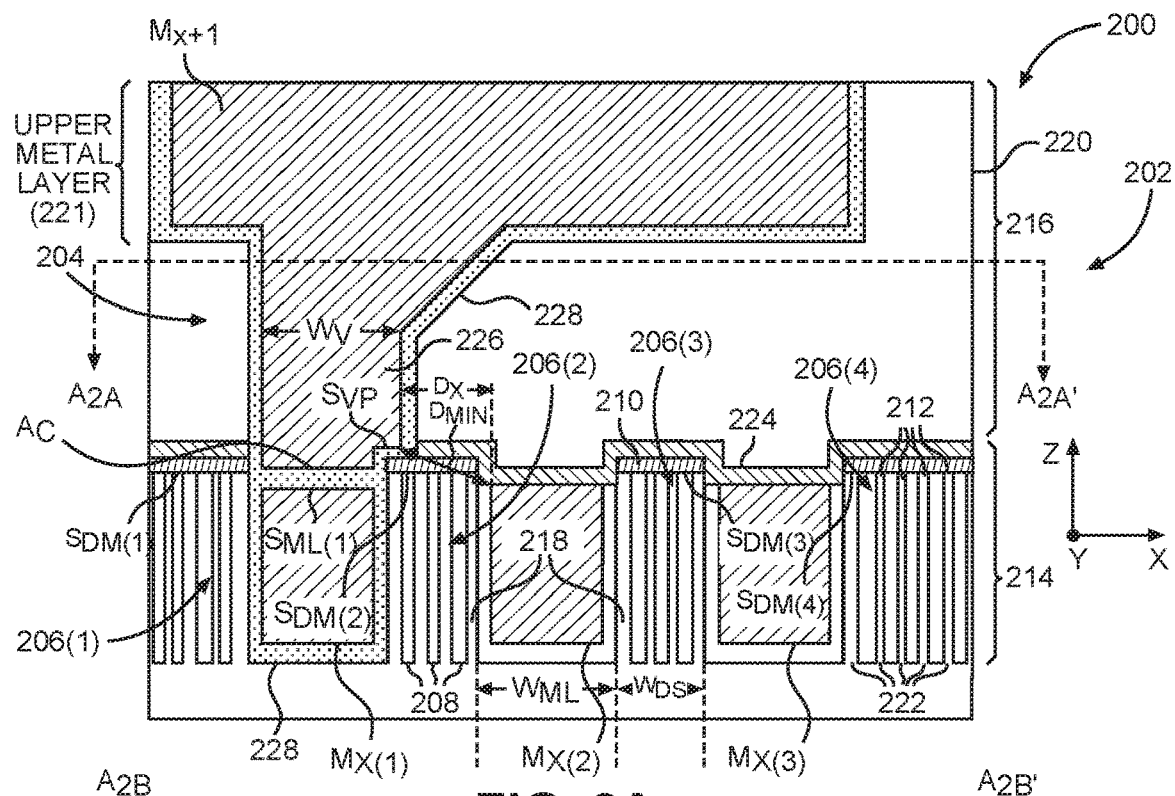
FIGS. 2A and 2B are a cross-sectional side view and a top view, respectively, of an interconnect structure in an IC that includes a self-aligned via interconnected to a metal line among adjacent metal lines which have a metal line pitch and are asymmetric in width to dielectric structures disposed between the adjacent metal lines to reduce electrical resistance, wherein the dielectric structures include a plurality of gaps to avoid an increase in capacitive coupling between adjacent metal lines.
Figure 2B:
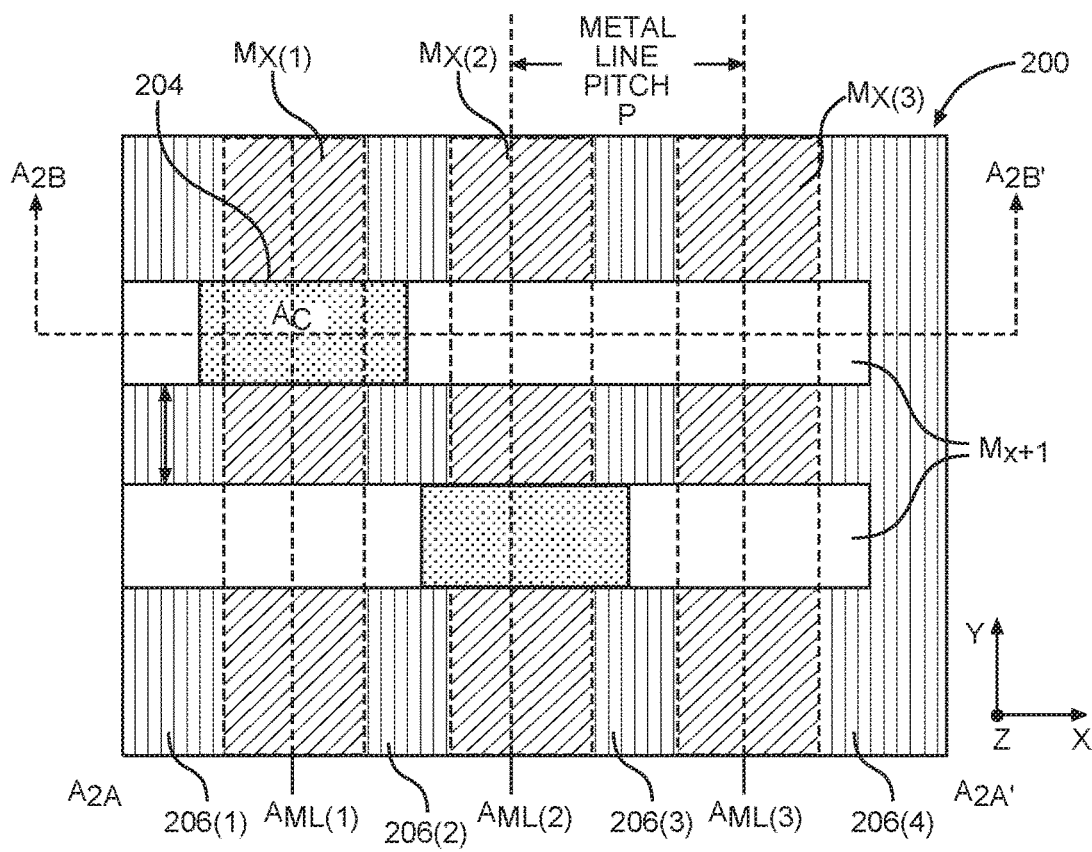

In this regard, FIGS. 2A and 2B are a cross-sectional side view and a top cross-sectional view, respectively, of an interconnect structure 200 in an IC 202. FIG. 2A is a cross-sectional side view at line $A_{2B}$-$A_{2B}'$ in FIG. 2B. FIG. 2B is a top view of a horizontal cross-section of the interconnect structure 200 in FIG. 2A at line $A_{2A}$-$A_{2A}'$. As will be discussed in more detail below, the interconnect structure 200 includes a self-aligned vertical interconnect access (via) 204 interconnected to a metal line $M_{X(1)}$ among metal lines $M_{X(1)}$-$M_{X(3)}$ that have a metal line pitch P and are asymmetric in width to dielectric structures 206(1)-206(4) disposed between the metal lines $M_{X(1)}$-$M_{X(3)}$ to reduce electrical resistance. The self-aligned via 204 may be fully self-aligned to the metal line $M_{X(1)}$. Dielectric structures 206(1)-206(4) are provided between the metal lines $M_{X(1)}$-$M_{X(3)}$ to isolate the metal lines $M_{X(1)}$-$M_{X(3)}$ from each other and to prevent electrical shorts. The material from which the dielectric structures 206(1)-206(4) are formed is selected to minimize capacitive coupling, as discussed below. The width of the metal lines $M_{X(1)}$-$M_{X(3)}$ is asymmetric to (e.g., greater than) the width of dielectric structures 206(1)-206(4) between the metal lines $M_{X(1)}$-$M_{X(3)}$. The asymmetry between the metal line $M_{X(1)}$ and its adjacent dielectric structure 206(2), for example, allows the metal line $M_{X(1)}$ to have a greater cross-sectional area without increasing the metal line pitch P. Increasing a cross-sectional area of the metal lines $M_{X(1)}$-$M_{X(3)}$ reduces electrical resistance through the metal lines $M_{X(1)}$-$M_{X(3)}$. Reducing electrical resistance in the metal lines $M_{X(1)}$-$M_{X(3)}$ can reduce an overall device resistance, which increases interconnected device switching speeds.

However, increasing a cross-sectional area of the metal lines $M_{X(1)}$-$M_{X(3)}$ by increasing a width of the metal lines $M_{X(1)}$-$M_{X(3)}$ without a change in the metal line pitch P reduces a separation distance between the metal lines $M_{X(1)}$-$M_{X(3)}$. As a result of the decreased separation distance, an electric field strength between the metal lines $M_{X(1)}$-$M_{X(3)}$ increases, which causes an increase in capacitive coupling between metal lines $M_{X(1)}$-$M_{X(3)}$, especially in metal lines that are adjacent to each other. The increase in capacitive coupling decreases device switching speeds and potentially offsets the positive effect of the reduced resistance of the metal lines $M_{X(1)}$-$M_{X(3)}$. Thus, as will also be discussed in more detail below, the interconnect structure 200 in FIGS. 2A and 2B provides for the dielectric structures 206(1)-206(4) to each include a plurality of gaps (e.g., air gaps) formed in a dielectric material of the dielectric structure to reduce the relative permittivity (i.e., k value) of the dielectric structures 206(1)-206(4), and thereby avoid an increase in capacitive coupling between adjacent metal lines $M_{X(1)}$-$M_{X(3)}$ as the distance between the metal lines $M_{X(1)}$-$M_{X(3)}$ is reduced. Reducing the relative permittivity of the dielectric structures 206(1)-206(4) can also reduce via-metal shorts between the self-aligned via 204 interconnecting with a metal line $M_{X(1)}$ (also referred to herein as the "destination metal line $M_{X(1)}$" as the interconnect destination of the self-aligned via 204) and an adjacent metal line (e.g., $M_{X(2)}$). Further, as an example, a plurality of gaps 208 formed in each of the dielectric structures 206(1)-206(4), as opposed to a single wider gap, may reduce deformation of a cover layer 210 employed to seal openings 212 at the top of each gap 208 during fabrication of the interconnect structure 200.

In this regard, with reference to FIGS. 2A and 2B, the interconnect structure 200 includes a lower metal layer 214 and a dielectric layer 216 formed on the lower metal layer 214. The lower metal layer 214 is formed of a plurality of metal lines $M_{X(1)}$-$M_{X(3)}$ spaced apart at the metal line pitch P in the X-axis direction, each of the plurality of metal lines $M_{X(1)}$-$M_{X(3)}$ having a longitudinal axis $A_{ML(1)}$-$A_{ML(3)}$ in the Y-axis direction, orthogonal to the X-axis direction, and a width $W_{ML}$ in the X-axis direction, as shown in cross-section in FIG. 2A as an example. Although only metal lines $M_{X(1)}$-$M_{X(3)}$ are shown in FIGS. 2A and 2B, the lower metal layer 214 may include additional metal lines. The metal lines $M_{X(1)}$-$M_{X(3)}$ are conductors that may each carry an electrical signal (e.g., voltage or current) within the lower metal layer 214 of the IC 202. The lower metal layer 214 also includes a plurality of the dielectric structures 206(1)-206(4) disposed between the plurality of metal lines $M_{X(1)}$-$M_{X(3)}$, such as dielectric structure 206(2) between the metal lines $M_{X(1)}$ and $M_{X(2)}$, and each of the dielectric structures 206(1)-206(4) has a width $W_{DS}$ in the X-axis direction that is less than the metal line width $W_{ML}$. The dielectric structures 206(1)-206(4) are formed of a dielectric material 218.

The dielectric layer 216 on the lower metal layer 214 is formed of a dielectric material 220 to electrically isolate the metal lines $M_{X(1)}$-$M_{X(3)}$ to prevent metal line shorting. The self-aligned via 204 extends through the dielectric layer 216 to contact a top surface $S_{ML(1)}$ of the metal line $M_{X(1)}$, which is a destination metal line of the plurality of metal lines $M_{X(1)}$-$M_{X(3)}$ in the lower metal layer 214. The self-aligned via 204 interconnects the metal line $M_{X(1)}$ in the lower metal layer 214 to an upper metal line $M_{X+1}$ in an upper metal layer 221 above the lower metal layer 214. The metal lines $M_{X(1)}$-$M_{X(3)}$ and $M_{X+1}$ and the self-aligned via 204 are typically formed of copper (Cu), but may be formed of another metal or other conductive material.

With continuing reference to FIGS. 2A and 2B, the metal lines $M_{X(1)}$-$M_{X(3)}$ in the lower metal layer 214 are asymmetric to the dielectric structures 206(1)-206(4). As shown, a width $W_{ML}$ of the metal lines $M_{X(1)}$-$M_{X(3)}$ is larger than a width $W_{DS}$ of the dielectric structures 206(1)-206(4). In other words, rather than the width $W_{ML}$ and the width $W_{DS}$ each being equal to ½ of a metal line pitch P in this example, the width $W_{ML}$ of the metal lines $M_{X(1)}$-$M_{X(3)}$ is greater than ½ P and the width $W_{DS}$ of the dielectric structures 206(1)-206(4) is less than ½ P in this example. The increase in width of the metal lines $M_{X(1)}$-$M_{X(3)}$ reduces electrical resistance in those lines, which can increase interconnected device switching speeds. However, as the distance $W_{DS}$ between respective metal lines $M_{X(1)}$-$M_{X(3)}$ is reduced, a parallel plate-like capacitance between the metal lines $M_{X(1)}$-$M_{X(3)}$ increases. To minimize a parallel plate-like capacitive coupling between the metal lines $M_{X(1)}$-$M_{X(3)}$, a material having a low relative permittivity (i.e., k value) is selected for the dielectric structures 206(1)-206(4). Thus, the dielectric structures 206(1)-206(4) are formed of the low relative permittivity dielectric material 218. The k value of the dielectric material 218 with which the dielectric structures 206(1)-206(4) are formed affects a strength of an electric field between respective metal lines among the plurality of metal lines $M_{X(1)}$-$M_{X(3)}$. A low k value material is any material with a dielectric constant (k value) lower than 4.2. By selecting a lower k value dielectric material, the electric field strength in the dielectric structures 206(1)-206(4) is reduced, so the parallel plate-like capacitive coupling between respective metal lines $M_{X(1)}$-$M_{X(3)}$ is reduced. Examples of low-k materials include fluorine-doped silicon dioxide, organosilicate glass, porous organosilicate glass, etc.

However, as a k value of a dielectric material decreases, a porosity of the material increases. The mechanical and electrical properties of low k value dielectrics tend to degrade when they are exposed to processes used in fabrication, such as etching, stripping, and cleaning. This problem raises serious challenges to integration with low k value dielectrics. For example, both chip performance and circuit reliability may be worse with an increase of porosity in dielectric materials. Packaging delamination problems also increase when low k value dielectrics are employed.

Thus, with continuing reference to FIGS. 2A and 2B, the dielectric structures 206(1)-206(4) are formed of a plurality of slices 222 of the low relative permittivity dielectric material 218 separated in the X-axis direction by the plurality of gaps 208. In the dielectric structures 206(1)-206(4), a slice 222 is a structure of the dielectric material 218 having a thickness (e.g., in the X-axis direction) and opposing planar surfaces extending in a height direction (e.g., Z-axis direction) and a length direction (e.g., Y-axis direction). In one example, a slice may be a monolithic structure in which the thickness remains constant over the height and length. In FIGS. 2A and 2B, the plurality of slices 222 of the dielectric material 218 in the dielectric structures 206(1)-206(4) may extend farther in the length direction (e.g., parallel to the metal lines $M_{X(1)}$-$M_{X(3)}$) than in the height direction.

Each gap 208 in the dielectric structures 206(1)-206(4) is a volume of space between two adjacent slices 222. Each gap 208 has a thickness (e.g., in the X-axis direction) equal to the distance separating the two adjacent slices, and extends in a height direction (e.g., Z-axis direction) and a length direction (e.g., Y-axis direction). In one example, a dielectric structure 206(1)-206(4) is formed of slices 222 having planar surfaces that are parallel to each other, such that the thickness of the gap 208 is constant in the length direction and the height direction. In this regard, the gaps 208 may be columnar and extend in the lengthwise direction between parallel slices 222. However, the dielectric structures 206(1)-206(4) are not limited to slices 222 having parallel planar surfaces. The gaps 208 are filled with a low k value medium to reduce the total k value of the dielectric structures 206(1)-206(4) below the k value of the dielectric material 218 so that an increase in capacitive coupling is avoided despite the reduction in width $W_{DS}$. As an example, employing atmospheric air, which has a k value of 1, as the medium in the gaps 208 would reduce an effective k value of the dielectric structures 206(1)-206(4). In the manufacturing process employed to create the gaps 208, openings 212 to the plurality of gaps 208 are formed in a top of the dielectric structures 206(1)-206(4). Atmospheric air may enter the gaps 208 through the openings 212. Alternatively, the gaps 208 could be filled with a gas (e.g., Helium, Nitrogen) other than atmospheric air, or could be filled with a fluid (e.g., spin-on organic polymeric dielectrics) or solid (e.g., porous carbon doped oxide) that has a k value lower than the dielectric material 218 of which the slices 222 are formed. Each of the dielectric structures 206(1)-206(4) includes a cover layer 210 formed across the openings 212 to seal the openings 212 of the plurality of gaps 208. By employing a non-conformal material for the cover layer 210, the cover layer 210 will span the opening 212 rather than filling the gap 208. Thus, the plurality of gaps 208 may include air gaps (e.g., sealed gaps or voids filled with air).

However, as a width of the opening 212 increases, the cover layer 210 may tend to deflect upward or downward into the gap 208. If the cover layer 210 deflects upward, the cover layer 210 may be penetrated during subsequent processing steps, such as plasma etching of the dielectric layer 216, allowing the medium in the gap 208 to be displaced by another material or be damaged in the processing. By forming a plurality of the gaps 208 with a smaller width, as opposed to one air gap with a larger width between respective metal lines $M_{X(1)}$-$M_{X(3)}$, the problem of deformation of the cover layer 210 can be minimized. As the width $W_{DS}$ of the dielectric structures 206(1)-206(4) includes a plurality of the gaps 208, the openings 212 of the gaps 208 are sufficiently narrow that a cover layer 210 formed over the openings 212 seals the gaps 208 but does not become as deformed as a cover layer 210 would become over a wider air gap. As discussed further below, the gaps 208 can be formed in the dielectric material 218 by employing a block copolymer layer (not shown) on the dielectric material 218 with an etchable portion that is etched away, and a non-etchable portion that serves as a mask for etching a plurality of columnar, parallel gaps 208 in the dielectric material 218 to form the plurality of slices 222 of the dielectric material 218. After disposing the block copolymer layer on top surfaces $S_{DM(1)}$-$S_{DM(4)}$ of the dielectric structures 206(1)-206(4), an annealing process forms first and second types of phase separation structures in the block copolymer layer. As noted above, the first type phase separation structures and the dielectric material 218 beneath the first type phase separation structures may be etched away to a desired depth, which may be shallower than, equal to, or deeper than a depth corresponding to the depth of the metal lines $M_{X(1)}$-$M_{X(3)}$, by employing the second type phase separation structures as a mask. The portions of the dielectric material 218 beneath the second type phase separation structures become the slices 222 of the dielectric material 218 in the dielectric structures 206(1)-206(4). The second type phase separation structures are removed before the cover layer 210 is formed.

With continuing reference to FIG. 2A, an etch stop layer 224 is formed on the lower metal layer 214 above the cover layers 210 and the dielectric material 220 is formed on the etch stop layer 224. The self-aligned via 204 has a width $W_V$ that is wider than the width $W_{ML}$ of the metal line $M_{X(1)}$. Thus, at least a portion of the self-aligned via 204 extends in the X-axis direction beyond the top surface $S_{ML(1)}$ of the metal line $M_{X(1)}$. The self-aligned via 204 is formed in the dielectric material 220 where a portion of the etch stop layer 224 is removed from the top surface $S_{ML(1)}$ of the metal line $M_{X(1)}$ and from an adjacent cover layer 210. The width $W_V$ of the self-aligned via 204 is made wider than $W_{ML}$ to ensure a maximum contact area $A_C$ between the self-aligned via 204 and the metal line $M_{X(1)}$ even if the self-aligned via 204 is misaligned with the metal line $M_{X(1)}$ due to a processing variation. The contact area $A_C$ between the self-aligned via 204 and the top surface $S_{ML(1)}$ of the metal line $M_{X(1)}$ is maximized to minimize electrical resistance in the self-aligned via 204. A misalignment of the self-aligned via 204 in FIG. 2A to the metal line $M_{X(1)}$ may result in a via portion 226 extending closer in the X-axis direction to adjacent metal line $M_{X(2)}$ than the metal line $M_{X(1)}$. As a result, a distance $D_X$ in the X-axis direction between the via portion 226 and the adjacent metal line $M_{X(2)}$ is less than a width $W_{DS}$ of the dielectric structure. However, an actual distance D m between the via portion 226 and the adjacent metal line $M_{X(2)}$ is greater than the distance $D_X$ because the metal lines $M_{X(1)}$-$M_{X(3)}$ are recessed below (e.g., in the Z-axis direction) the top of the dielectric structures 206(1)-206(4). In addition, a bottom surface $S_{VP}$ of the via portion 226 is higher in the Z-axis direction than the top surfaces $S_{DM(1)}$-$S_{DM(4)}$ of the dielectric material 218 of the slices 222 because the via portion 226 is formed above the cover layer 210. Therefore, a risk of electrical short between the via portion 226 of the self-aligned via 204 and the adjacent metal line $M_{X(2)}$ is not increased by a misalignment of the self-aligned via 204.

As shown in FIG. 2A, a diffusion barrier 228 separates the metal lines $M_{X(1)}$-$M_{X(3)}$ from the dielectric material 218 and separates the self-aligned via 204 and the upper metal line $M_{X+1}$ from the dielectric material 220 to avoid diffusion of metal atoms or ions into the dielectric materials 218 and 220, because such diffusion could lead to electrical shorts. The diffusion barrier 228 formed between the self-aligned via 204 and the lower metal line $M_{X(1)}$ increases resistance through the self-aligned via 204, but the diffusion barrier 228 is needed to avoid electro-migration of metal atoms across the contact area $A_C$. Electro-migration may result in the eventual loss of circuit connections and decrease of chip reliability. In general, diffusion barrier layers fail to prevent diffusion when a thickness of the diffusion barrier layer is less than about 2-3 nanometers (nm), so a minimum resistance of the diffusion barrier 228 is fixed based on a minimum functional thickness and such minimum resistance becomes a larger percentage of total via resistance as other resistances are reduced.

Figure 3:
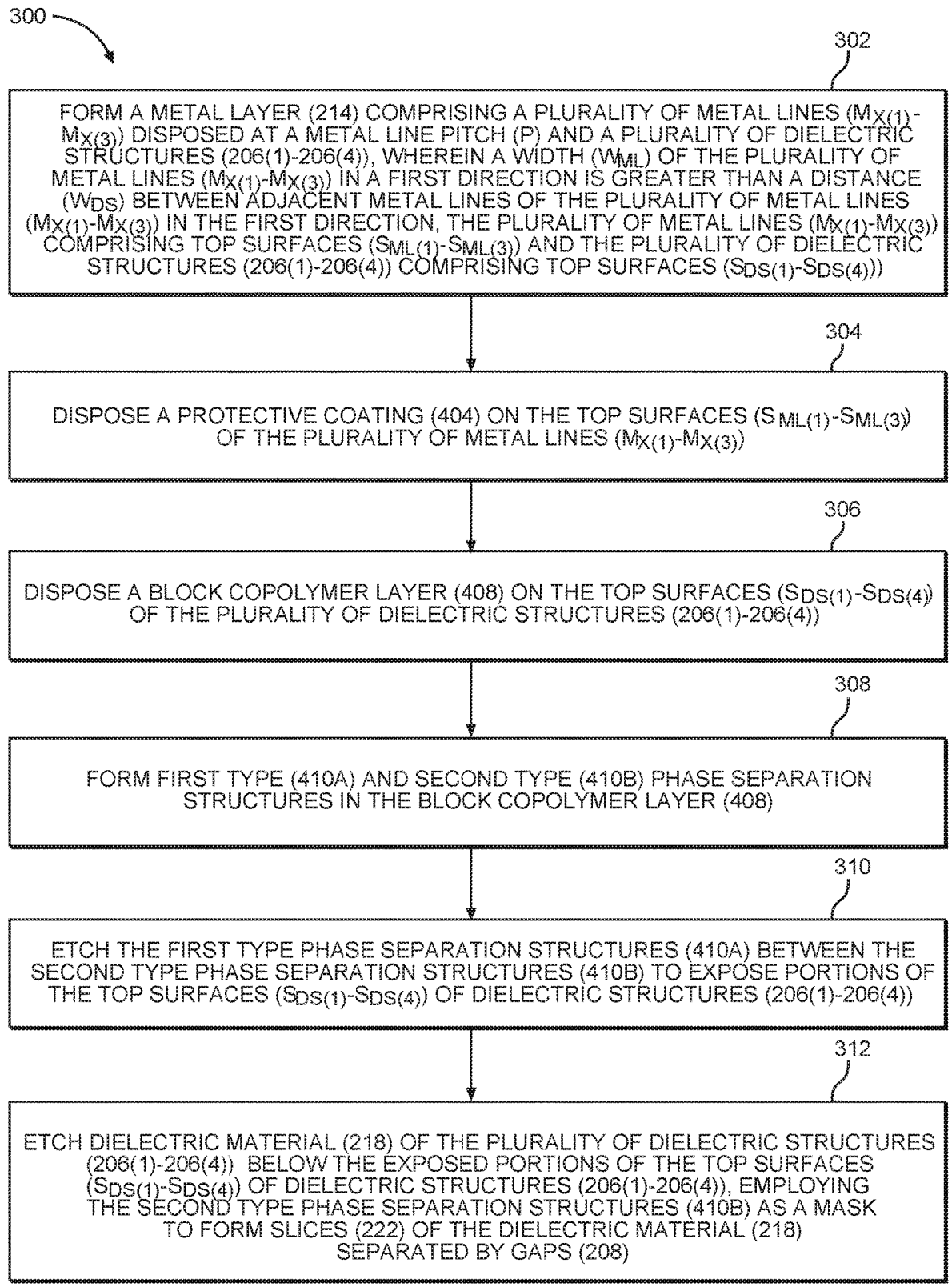
FIG. 3 is a flowchart illustrating an exemplary process for fabricating the interconnect structure in FIGS. 2A and 2B with asymmetric metal lines and dielectric structures.

FIG. 3 describes an exemplary process 300 of fabricating the interconnect structure 200 of FIGS. 2A and 2B with metal line-dielectric asymmetry and the gaps 208 in the dielectric structures 206(1)-206(4). The fabrication stages in the process 300 in FIG. 3 are illustrated respectively in FIGS. 4A-1 through 4N-2. FIGS. 4A-1 through 4N-2 reference steps in the process 300, as described below.

Figures 1, 4A:
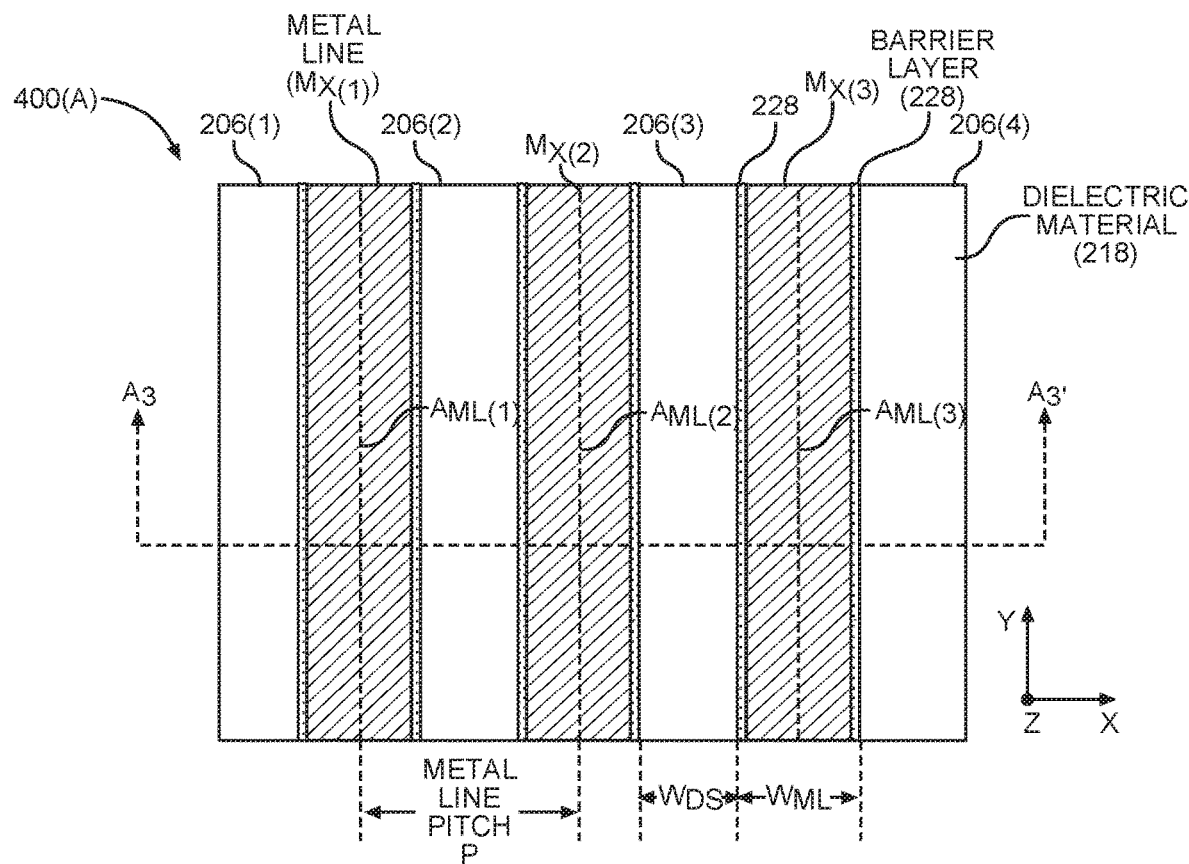
FIGS. 4A-1 and 4A-2 are a top view and a cross-sectional side view, respectively, of an exemplary fabrication stage in the process of FIG. 3 for fabricating the interconnect structure in FIGS. 2A and 2B, in which a metal layer comprising a plurality of metal lines of a metal line pitch is formed in a dielectric material for an interconnect structure supporting a via in the IC.
Figures 2, 4A:
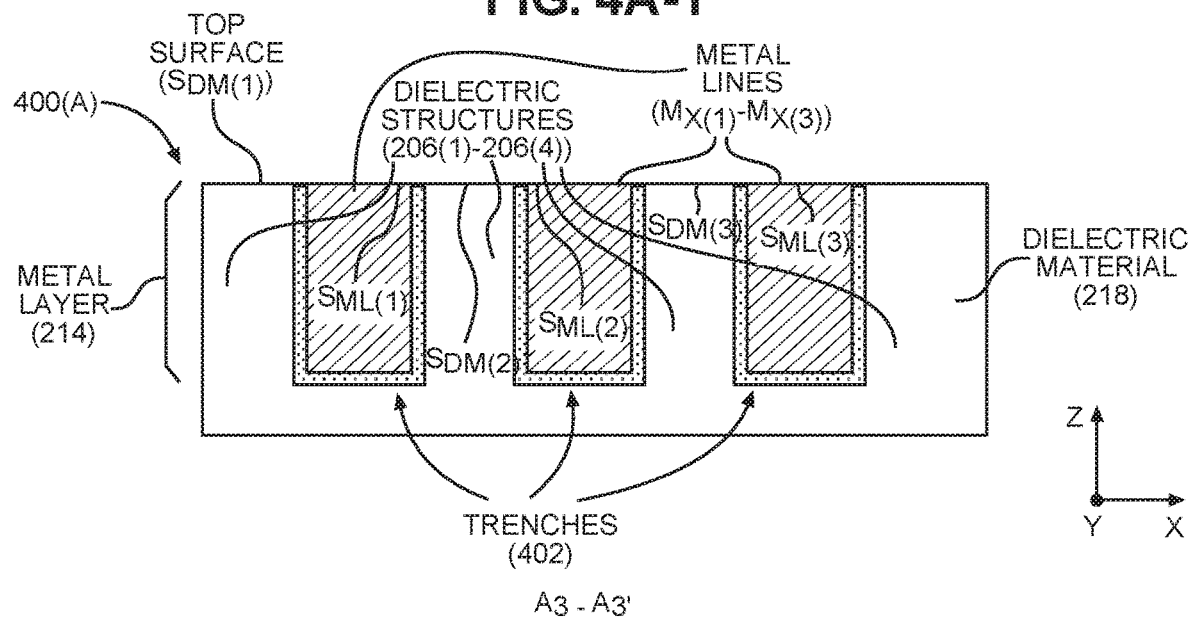

In this regard, fabricating the interconnect structure 200 in FIGS. 2A and 2B includes a fabrication stage 400(A) of forming a metal layer 214 comprising a plurality of metal lines $M_{X(1)}$-$M_{X(3)}$ disposed at a metal line pitch P, wherein a width of the metal lines $M_{X(1)}$-$M_{X(3)}$ in the X-axis direction is greater than a distance between adjacent metal lines $M_{X(1)}$ and $M_{X(2)}$ in the X-axis direction. The plurality of metal lines $M_{X(1)}$-$M_{X(3)}$ have top surfaces $S_{ML(1)}$-$S_{ML(3)}$, and the plurality of dielectric structures 206(1)-206(4) have top surfaces $S_{DM(1)}$-$S_{DM(4)}$ (block 302 in FIG. 3). FIG. 4A-1 is a top view of the fabrication stage 400(A) in which the metal layer 214 includes the metal lines $M_{X(1)}$-$M_{X(3)}$ spaced apart in the X-axis direction, having the longitudinal axis $A_{ML(1)}$-$A_{ML(3)}$ extending in the Y-axis direction and separated by the dielectric material 218, and FIG. 4A-2 is a cross-sectional side view at line $A_3$-$A_3'$ in FIG. 4A-1. The metal lines $M_{X(1)}$-$M_{X(3)}$ may be formed of, for example, copper (Cu), disposed in trenches 402 in the dielectric material 218. A diffusion barrier 228 is formed in the trenches 402 to prevent diffusion of metal atoms or ions from the metal of the metal lines $M_{X(1)}$-$M_{X(3)}$ into the dielectric material 218. In FIGS. 4A-1 and 4A-2, dielectric structures 206(1)-206(4) comprise dielectric material 218 without gaps 208. A width $W_{ML}$ of each of the metal lines $M_{X(1)}$-$M_{X(3)}$ is wider than the widths $W_{DS}$ of each of the dielectric structures 206(1)-206(4) between adjacent metal lines $M_{X(1)}$-$M_{X(3)}$. Thus, in this regard the metal layer 214 is asymmetric.

Figure 4B:
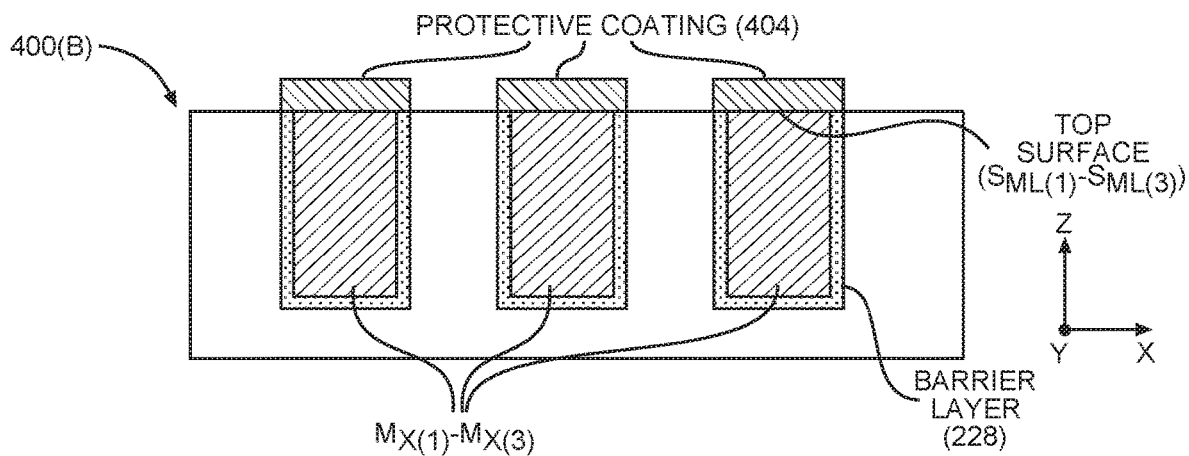
FIG. 4B is a cross-sectional side view of another exemplary fabrication stage in the process of FIG. 3 for fabricating the interconnect structure in FIGS. 2A and 2B, in which a protective coating is disposed on the top surfaces of the plurality of metal lines in the interconnect structure in FIGS. 4A-1 and 4A-2.

A next step in the process 300 in FIG. 3 is disposing a protective coating 404 on the top surfaces $S_{ML(1)}$-$S_{ML(3)}$ of the plurality of metal lines $M_{X(1)}$-$M_{X(3)}$ (block 304 in FIG. 3). FIG. 4B is a cross-sectional side view of fabrication stage 400(B) in which the protective coating 404 may be disposed by, for example, selective chemical vapor deposition (CVD). The protective coating 404 may comprise, for example, Ruthenium (Ru) with a Ruthenium carbonyl precursor (e.g., $Ru_2(CO)_5$) or Cobalt (Co) with a Cobalt carbonyl precursor (e.g., $Co_2(CO)_8$). The protective coating 404 may be approximately 10 nm in thickness but the protective coating 404 may also be in the range from about 7 nm to about 13 nm in thickness. As shown in FIG. 4B, the protective coating 404 may be applied onto the top surfaces $S_{ML(1)}$-$S_{ML(3)}$ of the metal lines $M_{X(1)}$-$M_{X(3)}$ and the diffusion barrier 228.

Figure 4C:
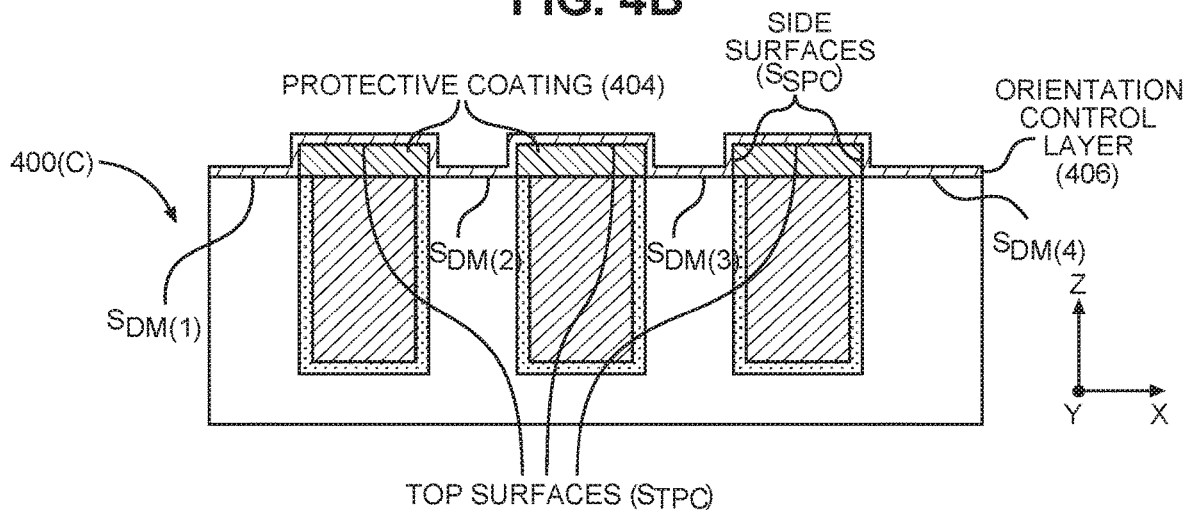
FIG. 4C is a cross-sectional side view of an exemplary fabrication stage in the process of FIG. 3 for fabricating the interconnect structure in FIGS. 2A and 2B, in which a conformal orientation control layer is disposed over the top surfaces of the dielectric structures and on the top and side surfaces of the protective coating in the interconnect structure in FIG. 4B.
Figure 4D:
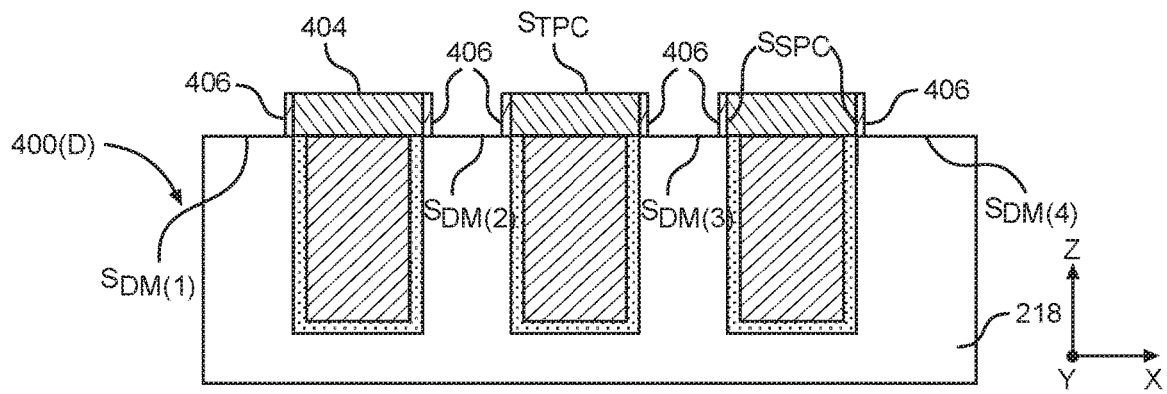
FIG. 4D is a cross-sectional side view of another exemplary fabrication stage in the process of FIG. 3 for fabricating the interconnect structure in FIGS. 2A and 2B, in which portions of the conformal orientation control layer are removed from the top surfaces of the dielectric structures and the top surface of the protective coating by anisotropic etching of the interconnect structure in FIG. 4C.

FIGS. 4C and 4D are cross-sectional side views of fabrication stages 400(C) and 400(D), respectively, which comprise disposing an orientation control layer 406 on side surfaces $S_{SPC}$ of the protective coating 404. Disposing the orientation control layer 406 may comprise a conformal growth of the orientation control layer 406 over the top surfaces $S_{DM(1)}$-$S_{DM(4)}$ of the dielectric structures 206(1)-206(4) and over the side surfaces $S_{SPC}$ and the top surface $S_{TPC}$ of the protective coating 404. The orientation control layer 406 may be grown to a thickness of approximately 5 nm, for example. The orientation control layer 406 may comprise, for example, a hydroxylated polystyrene-(random)-polymethylmethacrylate (PS-r-PMMA-OH) copolymer that is dissolved in an organic solvent, such as propylene glycol monomethyl ether acetate (PGMEA), 4-methl-2-pentanol, n-butyl acetate, gamma-butyrolactone, toluene, or acetone, and may be deposited by spin coating. The top surfaces $S_{DM(1)}$-$S_{DM(4)}$ of the dielectric structures 206(1)-206(4) may be heated up to 400° C. to graft brush a material to form the orientation control layer 406 on the top surfaces $S_{DM(1)}$-$S_{DM(4)}$ and side surfaces $S_{SPC}$.

In fabrication stage 400(D) in FIG. 4D, the orientation control layer 406 is removed from horizontal surfaces including the top surface $S_{TPC}$ of the protective coating 404 and the top surfaces $S_{DM(1)}$-$S_{DM(4)}$ of the dielectric structures 206(1)-206(4) formed of the dielectric material 218 by anisotropic etching. As shown, the orientation control layer 406 is not removed from the side surfaces $S_{SPC}$ of the protective coating 404 by the anisotropic etching. Following fabrication stage 400(D), the orientation control layer 406 is disposed on the side surfaces $S_{SPC}$ of the protective coating 404.

Figure 4E:
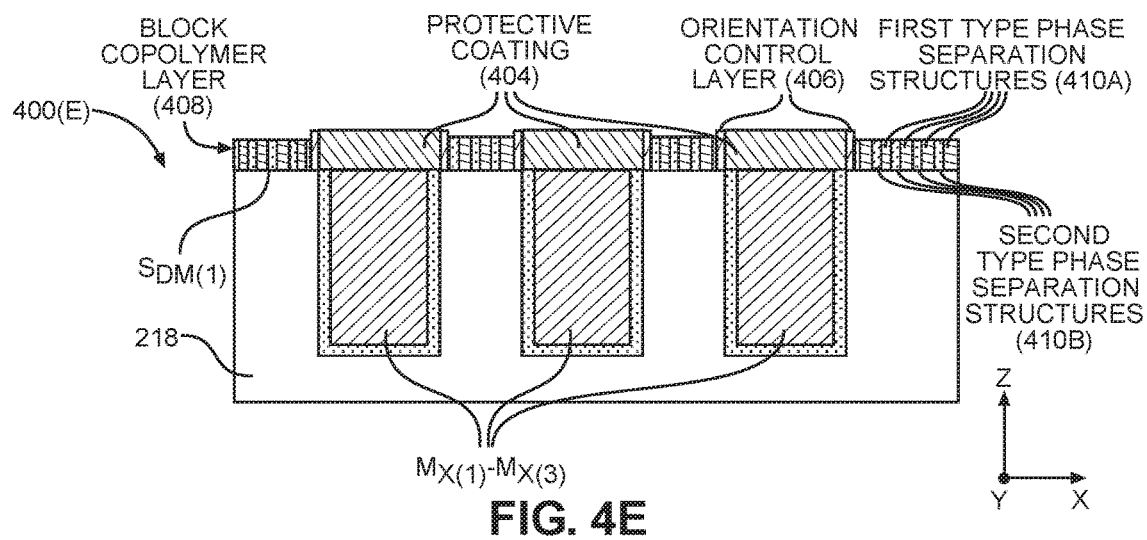
FIG. 4E is a cross-sectional side view of another exemplary fabrication stage in the process of FIG. 3 for fabricating the interconnect structure in FIGS. 2A and 2B, in which a block copolymer layer is disposed on the top surfaces of the dielectric structures and first type and second type phase separation structures are formed in the block copolymer layer in the interconnect structure in FIG. 4D.

The fabrication stage 400(E) in FIG. 4E includes a next step in the process 300 in FIG. 3 of disposing a block copolymer layer 408 on the top surfaces $S_{DM(1)}$-$S_{DM(4)}$ of the plurality of dielectric structures 206(1)-206(4) (block 306 in FIG. 3). FIG. 4E is a cross-sectional side view of the fabrication stage 400(E) in which disposing the block copolymer layer 408 may comprise, for example, depositing a layer of one of polystyrene-block-polymethyl methacrylate (PS-b-PMMA), polystyrene-block-polybutadiene (PS-b-PB), and polystyrene-block-2-vinylpyridine (PS-b-P2VP). The fabrication stage 400(E) shown in FIG. 4E further includes forming first type and second type phase separation structures 410A and 410B, respectively, in the block copolymer layer 408 (block 308 in FIG. 3) by annealing the block copolymer layer 408. Annealing the block copolymer layer 408 in a manner known to those of ordinary skill in the art (e.g., a solvent vapor annealing process), may cause the block copolymer layer 408 located between portions of the protective coating 404 to be assembled into patterns, such as the parallel first and second type phase separation structures 410A and 410B, respectively, shown in FIG. 4E.

Figure 4F:
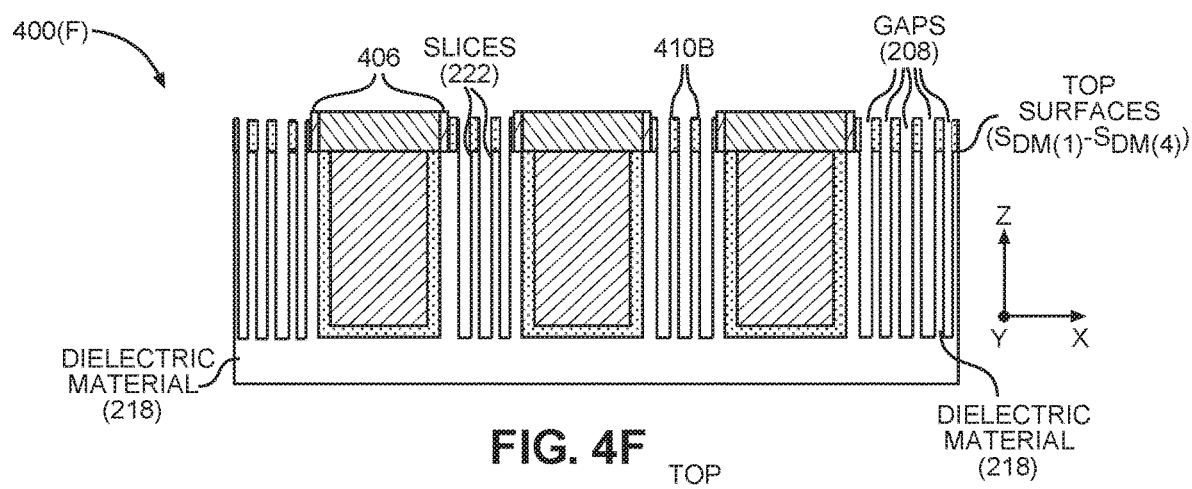
FIG. 4F is a cross-sectional side view of an exemplary fabrication stage in the process of FIG. 3 for fabricating the interconnect structure in FIGS. 2A and 2B, in which the first type phase separation structures are removed and dielectric material of the dielectric structures is etched to form gaps in the dielectric structures in the interconnect structure in FIG. 4E.

The fabrication stage 400(F) in FIG. 4F includes etching the first type phase separation structures 410A (not shown) between the second type phase separation structures 410B to expose portions of the top surfaces $S_{DM(1)}$-$S_{DM(4)}$ of the plurality of dielectric structures 206(1)-206(4) (block 310 in FIG. 3). FIG. 4F is a cross-sectional side view of the fabrication stage 400(F) in which the first type phase separation structures 410A, which may comprise an etchable material (e.g., polymethyl methacrylate), are removed by etching from between portions of the second type phase separation structures 410B, which may comprise an unetchable material (e.g., polystyrene). The fabrication stage 400(F) further includes etching the dielectric material 218 of the plurality of dielectric structures 206(1)-206(4) below the exposed portions of the top surfaces $S_{DM(1)}$-$S_{DM(4)}$ of the plurality of dielectric structures 206(1)-206(4), employing the second type phase separation structures 410B as a mask to form slices 222 of the dielectric material 218 separated by gaps 208 (block 312 in FIG. 3). The slices 222 are portions of the dielectric material 218 that are protected from the etching by the second type phase separation structures 410B. The slices 222 of the dielectric material 218 are separated by the gaps 208 created where the dielectric material 218 is etched away. The slices 222 may have a dielectric depth shallower than, equal to, or deeper than a depth of the plurality of metal lines $M_{X(1)}$-$M_{X(3)}$. In this regard, a k value of the dielectric structures 206(1)-206(4) is reduced below a k value of the dielectric material 218 due to the formation of the gaps 208.

Figure 4G:
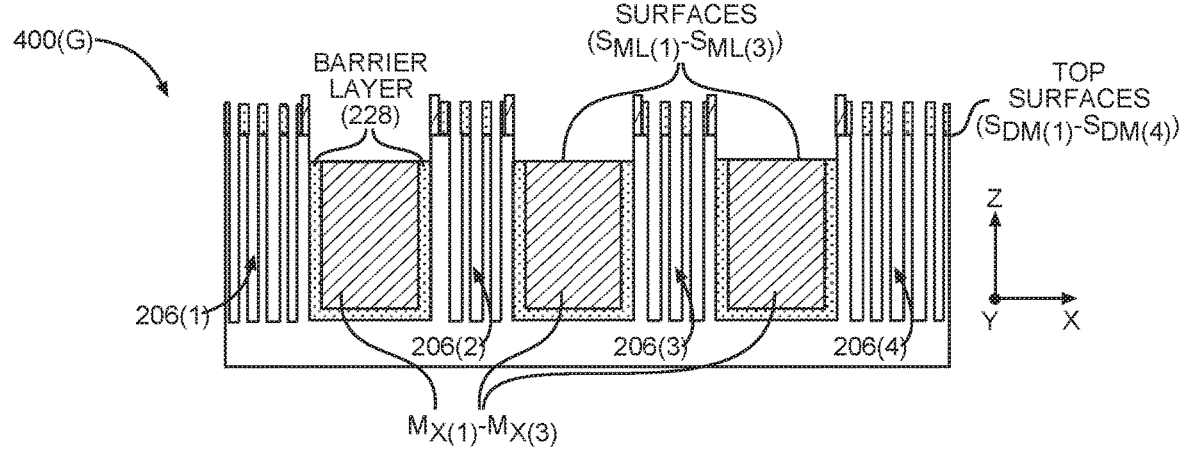
FIG. 4G is a cross-sectional side view of another exemplary fabrication stage in the process of FIG. 3 for fabricating the interconnect structure in FIGS. 2A and 2B, in which the protective coating on the metal lines is removed and the top surfaces of the metal lines are etched to recess the top surfaces of the metal lines below the top surfaces of the dielectric structures in the interconnect structure in FIG. 4F.

The fabrication stage 400(G) in FIG. 4G includes removing the protective coating 404 (not shown) from the metal lines $M_{X(1)}$-$M_{X(3)}$ and etching the top surfaces $S_{ML(1)}$-$S_{ML(3)}$ of the plurality of metal lines $M_{X(1)}$-$M_{X(3)}$ to recess the top surfaces $S_{ML(1)}$-$S_{ML(3)}$ of the plurality of metal lines $M_{X(1)}$-$M_{X(3)}$ below the top surfaces $S_{DM(1)}$-$S_{DM(4)}$ of the plurality of dielectric structures 206(1)-206(4). FIG. 4G is a cross-sectional side view of the fabrication stage 400(G) in which the top surfaces $S_{ML(1)}$-$S_{ML(3)}$ of the metal lines $M_{X(1)}$-$M_{X(3)}$ may be selectively etched by employing, for example, a selective chlorine-based plasma to recess the top surfaces $S_{ML(1)}$-$S_{ML(3)}$ of the metal lines $M_{X(1)}$-$M_{X(3)}$. In the same manner, the diffusion barrier 228 may also be recessed below the top surfaces $S_{DM(1)}$-$S_{DM(4)}$ of the dielectric structures 206(1)-206(4) to correspond to the top surfaces $S_{ML(1)}$-$S_{ML(3)}$ of the metal lines $M_{X(1)}$-$M_{X(3)}$.

Figure 4H:
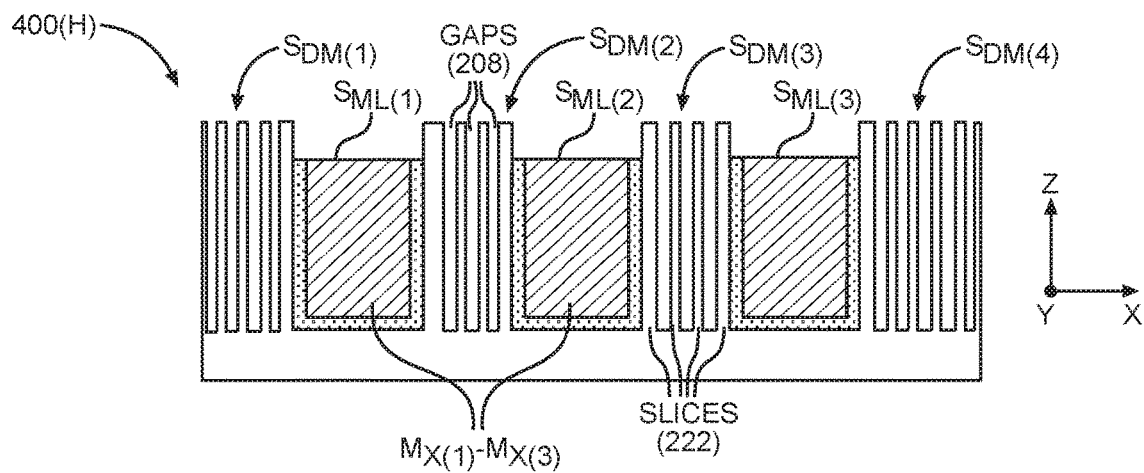
FIG. 4H is a cross-sectional side view of another exemplary fabrication stage in the process of FIG. 3 for fabricating the interconnect structure in FIGS. 2A and 2B, in which remaining portions of the conformal orientation control layer and the second type phase separation structures are removed from the interconnect structure in FIG. 4G.

The fabrication stage 400(H) in FIG. 4H includes removing the orientation control layer 406 and the second type phase separation structures 410B from the top surfaces $S_{DM(1)}$-$S_{DM(4)}$ of the dielectric structures 206(1)-206(4) in the fabrication stage 400(G). FIG. 4H is a cross-sectional view of the fabrication stage 400(H) in which the orientation control layer 406 and second type phase separation structures 410B are removed. The second type phase separation structures 410B may comprise an unetchable polymer material. Removing the second type phase separation structures 410B and the orientation control layer 406 may comprise employing a wet clean process. In this regard, the top surfaces $S_{ML(1)}$-$S_{ML(3)}$ of the metal lines $M_{X(1)}$-$M_{X(3)}$ are recessed below the top surfaces $S_{DM(1)}$-$S_{DM(4)}$ of the dielectric structures 206(1)-206(4). As shown, a plurality of slices 222 of the dielectric material 218 separated by respective gaps 208 stands between adjacent metal lines, such as metal lines $M_{X(1)}$ and $M_{X(2)}$.

Figure 4I:
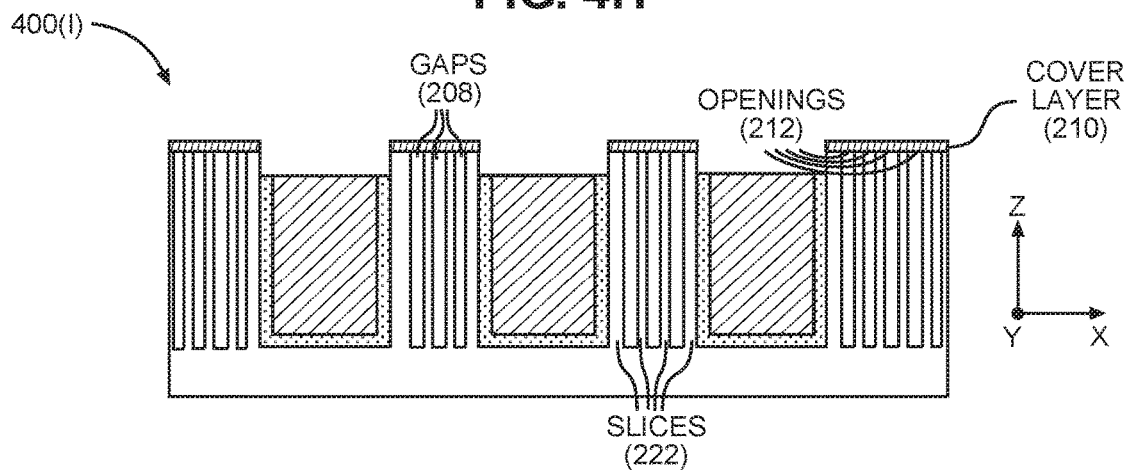
FIG. 4I is a cross-sectional side view of another exemplary fabrication stage in the process of FIG. 3 for fabricating the interconnect structure in FIGS. 2A and 2B, in which a cover layer is disposed on the top surfaces of the dielectric structures to seal openings in the gaps in the interconnect structure in FIG. 4H.

The fabrication stage 400(I) in FIG. 4I includes disposing the cover layer 210 on the top surfaces $S_{DM(1)}$-$S_{DM(4)}$ of the plurality of dielectric structures 206(1)-206(4) to seal openings 212 of the gaps 208. FIG. 4I is a cross-sectional view of the fabrication stage 400(I) in which disposing the cover layer 210 may comprise, for example, selective deposition of silicon oxide (SiO) on the top surfaces $S_{DM(1)}$-$S_{DM(4)}$ of the dielectric structures 206(1)-206(4) to seal the openings 212 with air in the gaps 208. The cover layer 210 may be a non-conformal material that spans across and seals the openings 212 without filling into the gaps 208. The openings 212 of the gaps 208 may be narrower than an opening in a dielectric structure having a single wider air gap, thereby reducing deformation (up or down) of the cover layer 210 in the openings 212.

Figure 4J:
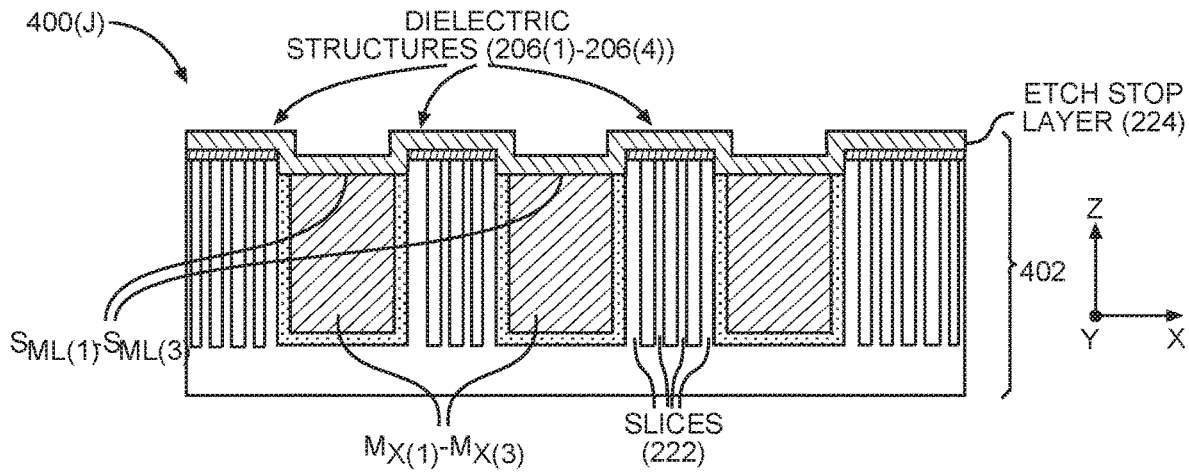
FIG. 4J is a cross-sectional side view of an exemplary fabrication stage in the process of FIG. 3 for fabricating the interconnect structure in FIGS. 2A and 2B, in which an etch stop layer is disposed on the metal layer in the interconnect structure in FIG. 4I.

The fabrication stage 400(J) in FIG. 4J includes disposing an etch stop layer 224 on the metal layer 214. FIG. 4J is a cross-sectional side view of the fabrication stage 400(J) in which disposing the etch stop layer 224 may comprise, for example, conformal deposition of a layer of silicon nitride (SiN), aluminum nitride (AlN), or oxygen-doped carbide (ODC). The etch stop layer 224 is disposed across the recessed top surfaces $S_{ML(1)}$-$S_{ML(3)}$ of the metal lines $M_{X(1)}$-$M_{X(3)}$ and across the dielectric structures 206(1)-206(4), including the cover layers 210.

Figures 1, 4K:
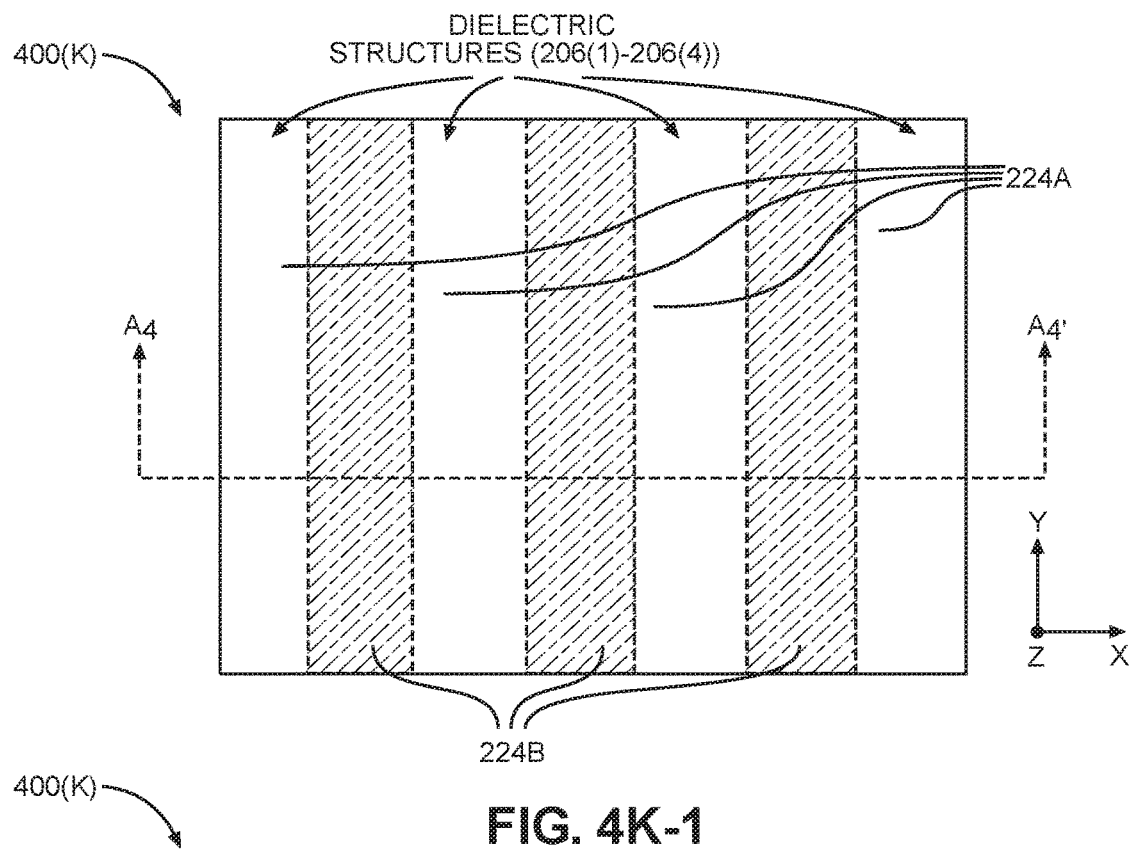
Figures 2, 4K:
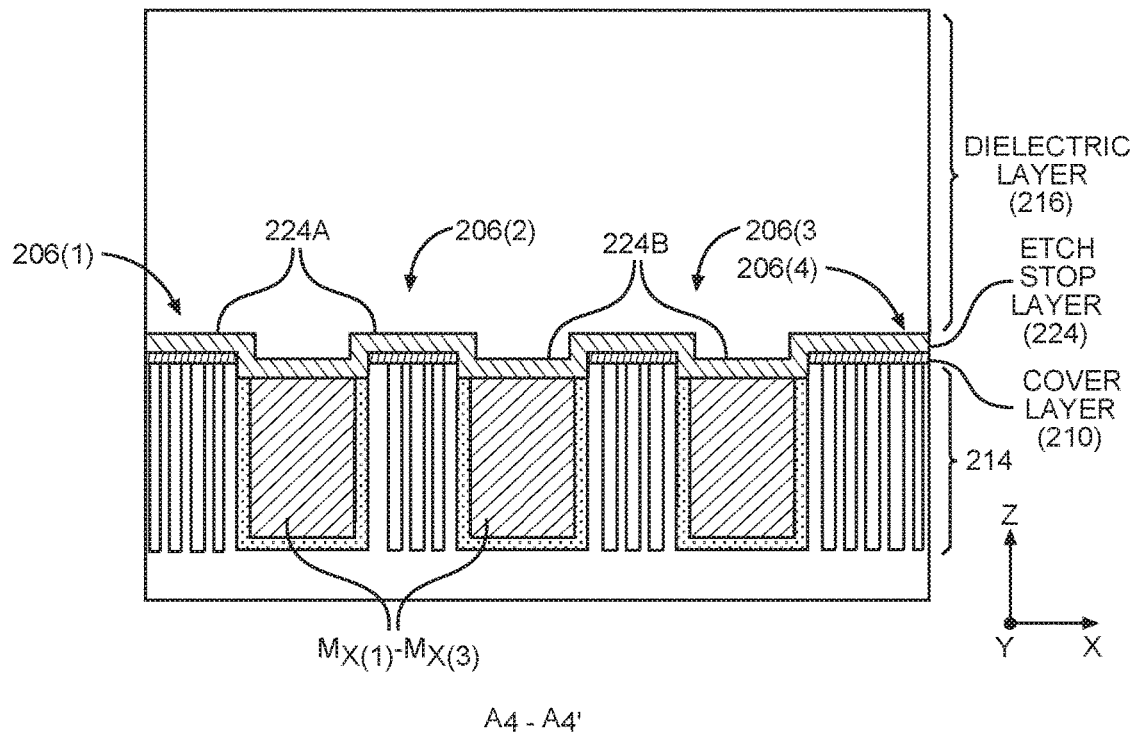

The fabrication stage 400(K) in FIGS. 4K-1 and 4K-2 includes disposing a dielectric layer 216 on the etch stop layer 224. FIG. 4K-1 and FIG. 4K-2 are a top view and a cross-sectional side view, respectively, of the fabrication stage 400(K) in which the dielectric layer 216 comprises, for example, an inter-layer dielectric (ILD) formed of organo-silicate glass deposited above the metal layer 214. The top view in FIG. 4K-1 shows portions 224A of the etch stop layer 224 deposited on the cover layers 210 on the dielectric structures 206(1)-206(4) and portions 224B of the etch stop layer 224 deposited on the recessed top surfaces $S_{ML(1)}$-$S_{ML(3)}$ of the metal lines $M_{X(1)}$-$M_{X(3)}$. The cross-sectional side view in FIG. 4K-2, taken at line $A_4$-$A_4'$ in FIG. 4K-1, shows that portions 224B of the etch stop layer 224 are recessed with respect to portions 224A. The portions 224A and 224B are asymmetric because the widths of the dielectric structures 206(1)-206(4) are asymmetric to the widths of the metal lines $M_{X(1)}$-$M_{X(3)}$.

Figures 1, 4L:
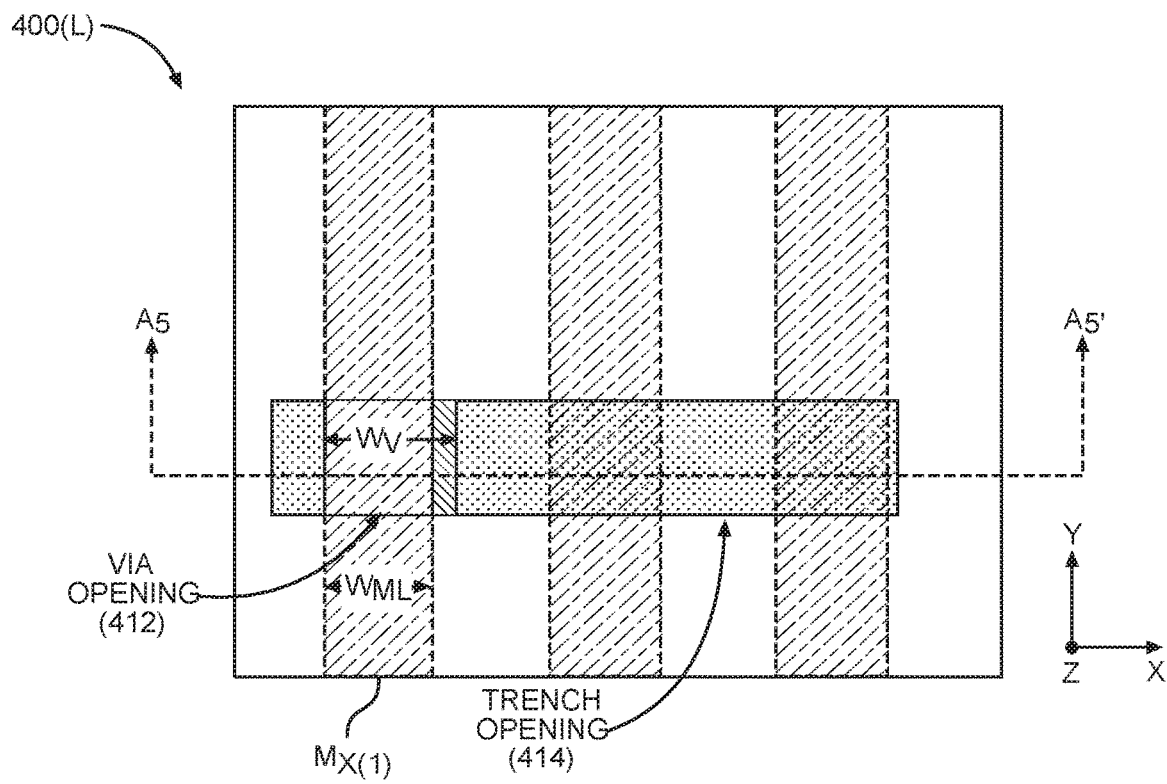
Figures 2, 4L:
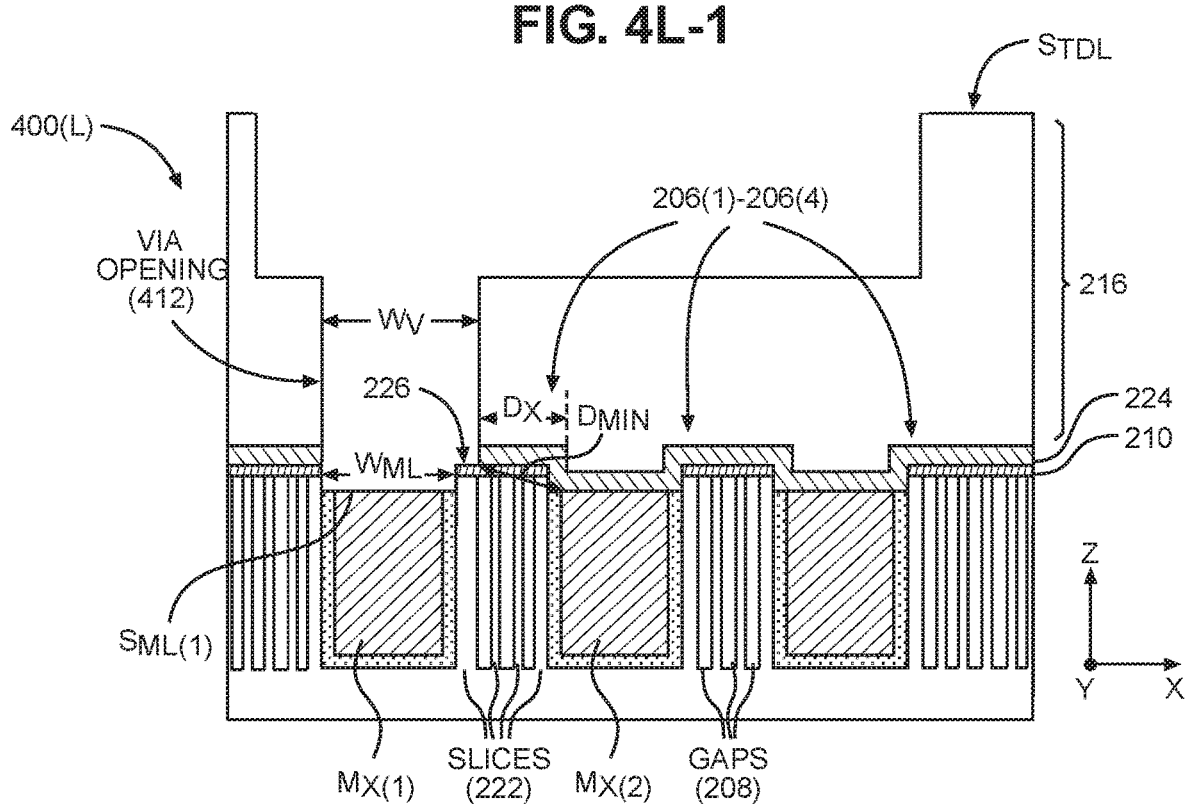

The fabrication stage 400(L) in FIGS. 4L-1 and 4L-2 includes etching the dielectric layer 216 and the etch stop layer 224 to form a via opening 412 from a top surface $S_{TDL}$ of the dielectric layer 216 to the top surface $S_{ML(1)}$ of the destination metal line $M_{X(1)}$. FIG. 4L-1 is a top view of the fabrication stage 400(L) in which the via opening 412 may be etched in the dielectric layer 216. Etching the dielectric layer 216 may include etching to form a trench opening 414 for an upper metal line $M_{X+1}$ (not shown) that will be coupled to the destination metal line $M_{X(1)}$ when the via opening 412 is filled with metal. FIG. 4L-2 is a cross-sectional side view of the fabrication stage 400(L) taken at the line $A_5$-$A_5'$ of the FIG. 4L-1. As shown, the via 204 (see FIGS. 4N-1 and 4N-2) will be self-aligned such that a width $W_V$ of the via opening 412 is wider than a width $W_{ML}$ of the metal line $M_{X(1)}$ to ensure that contact between the via 204 and the top surface $S_{ML(1)}$ of the metal line $M_{X(1)}$ extends the full width $W_{ML}$ to minimize resistance in the via 204. In this regard, the via opening 412 is fully self-aligned with the recessed top surface $S_{ML(1)}$. In FIG. 4L-2, the via opening 412 is wider than the metal line $M_{X(1)}$ such that a portion 226 of the via opening 412 extends over the cover layer 210, reducing a horizontal distance $D_X$ between the via 204 and the metal line $M_{X(2)}$ which is adjacent to the destination metal line $M_{X(1)}$. However, because the metal line $M_{X(2)}$ is recessed with respect to the dielectric structure 206(2), a minimum distance $D_{MIN}$ from the via portion 226 to the adjacent metal line $M_{X(2)}$ is greater than the horizontal distance $D_X$. In this regard, and in view of the reduced deformation of the cover layer 210, a short between the self-aligned via 204 in the via opening 412 and the adjacent metal line $M_{X(2)}$ through the dielectric structure 206(2) is avoided. In addition, the gaps 208 within the dielectric structure 206(2) reduce the effective k value of the dielectric structure 206(2) over the distance $D_{MIN}$ to further reduce capacitive coupling between the via 204 and the metal line $M_{X(2)}$.

Figures 1, 4M:
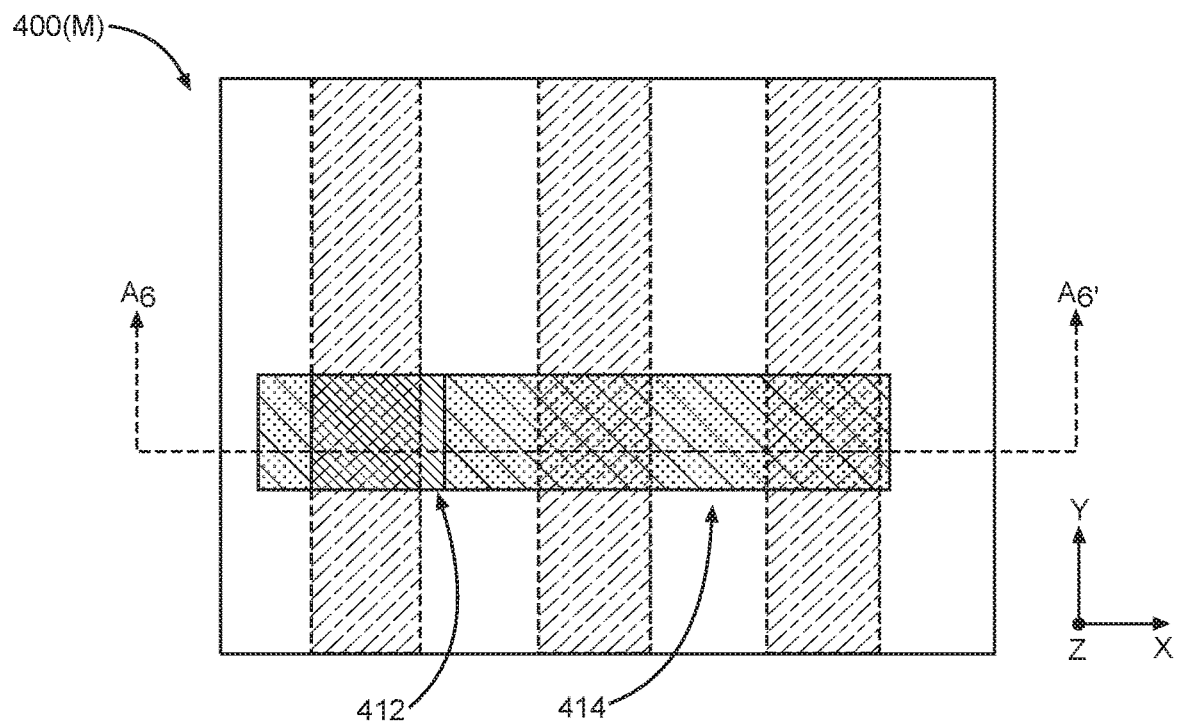
Figures 2, 4M:
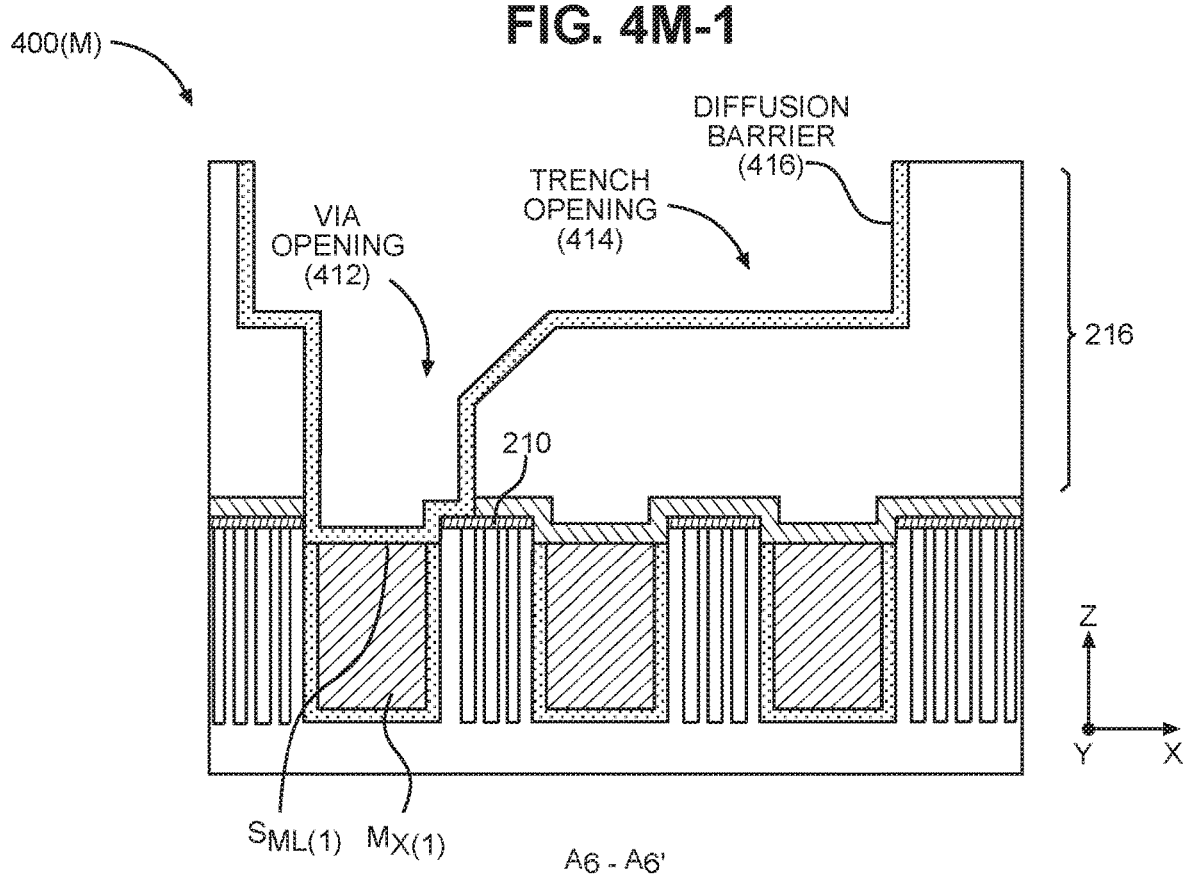

The fabrication stage 400(M) in FIGS. 4M-1 and 4M-2 includes disposing a diffusion barrier 416 in the via opening 412 and in the trench opening 414 in the dielectric layer 216. FIG. 4M-1 is a top view of the fabrication stage 400(M) in which the diffusion barrier 416 is disposed by depositing, for example, a barrier metal such as Tantalum Nitride (TaN), Cobalt (Co), or another barrier metal known in the art. FIG. 4M-2 is a cross-sectional view taken at line $A_6$-$A_6'$ in FIG. 4M-1 showing that, in addition to the diffusion barrier 416 being deposited on surfaces of the dielectric layer 216, the diffusion barrier 416 is also deposited on the top surface $S_{ML(1)}$ of the metal line $M_{X(1)}$ to avoid electro-migration of Cu atoms between the metal line $M_{X(1)}$ and the via 204.

Figures 1, 4N:
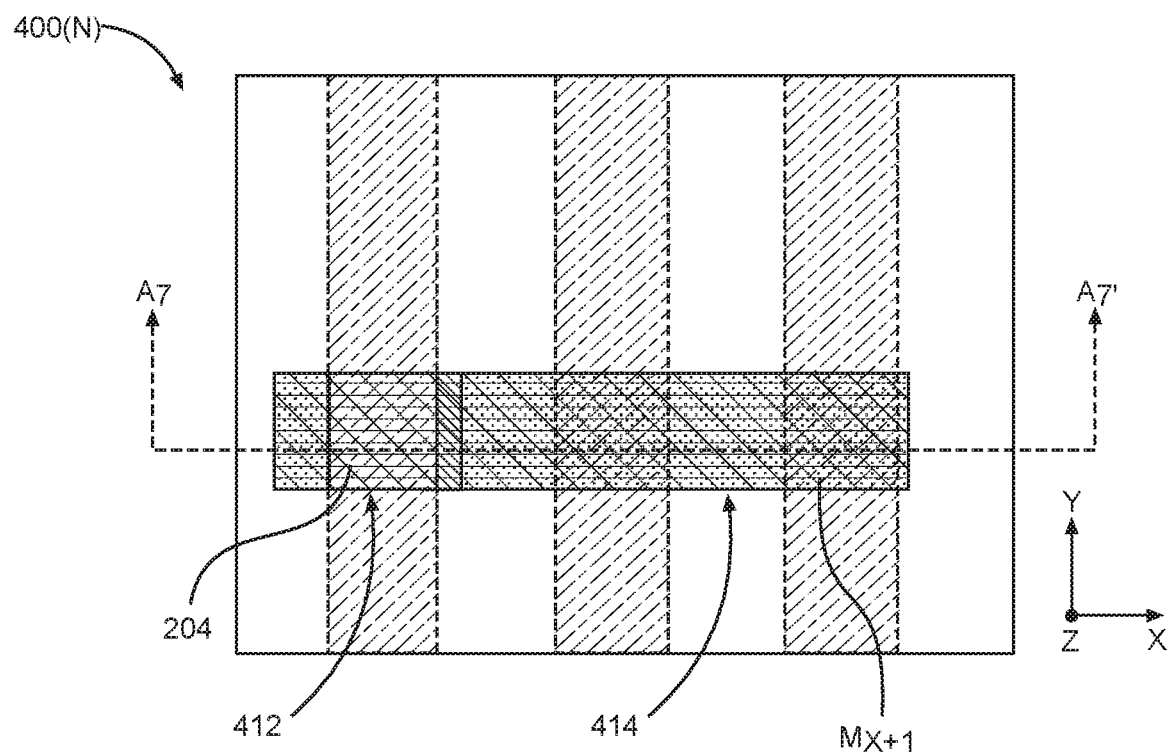
Figures 2, 4N:
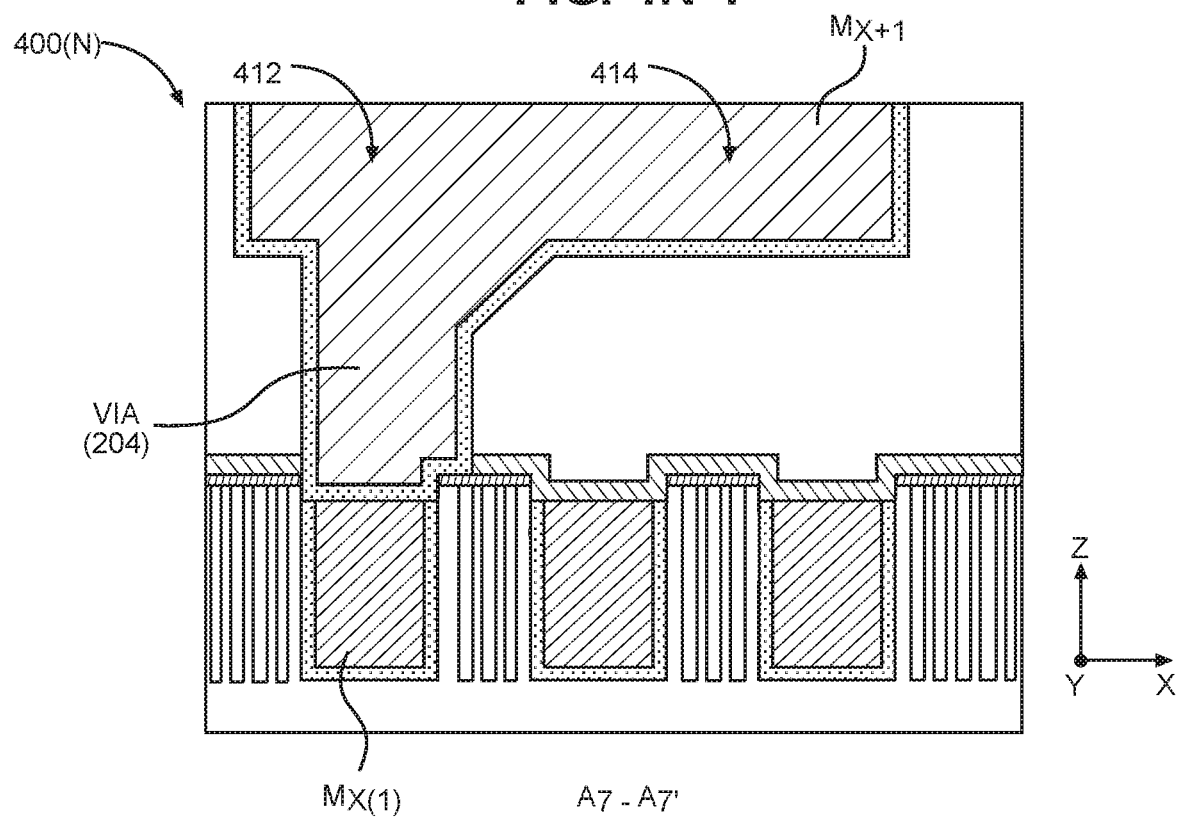

The fabrication stage 400(N) in FIGS. 4N-1 and 4N-2 includes disposing metal in the via opening 412 to form a self-aligned via 204 in contact with the lower metal line $M_{X(1)}$ and also disposing metal in the trench opening 414 to form an upper metal line $M_{X+1}$ coupled to the lower metal line $M_{X(1)}$ by the via 204. FIG. 4N-1 is a top view of the fabrication stage 400(N) in which a metal (e.g., Cu, Co, or Ru) is disposed in the via opening 412 and the trench opening 414 in the dielectric layer 216 by a plating process. FIG. 4N-2 is a cross-sectional view taken at line $A_7$-$A_7'$ in FIG. 4N-1 showing that the via 204 and the upper metal line $M_{X+1}$ may be formed continuously in a single metal plating step such as, for example, a dual damascene process. Disposing the metal in the via opening 412 and the trench opening 414 forms the self-aligned via 204 and couples the metal line $M_{X(1)}$ to the upper metal line $M_{X+1}$ by the self-aligned via 204. The fabrication stage 400(N) in FIGS. 4N-1 and 4N-2 corresponds to the interconnect structure 200 in FIGS. 2A and 2B.

Interconnect structures in which a via interconnects to a metal line among adjacent metal lines that have a metal line pitch and are asymmetric in width to dielectric structures disposed between the adjacent metal lines to reduce electrical resistance, and the dielectric structures include a plurality of gaps to avoid an increase in capacitive coupling as illustrated in FIGS. 2A-2B and 4N-1-4N-2, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 5:
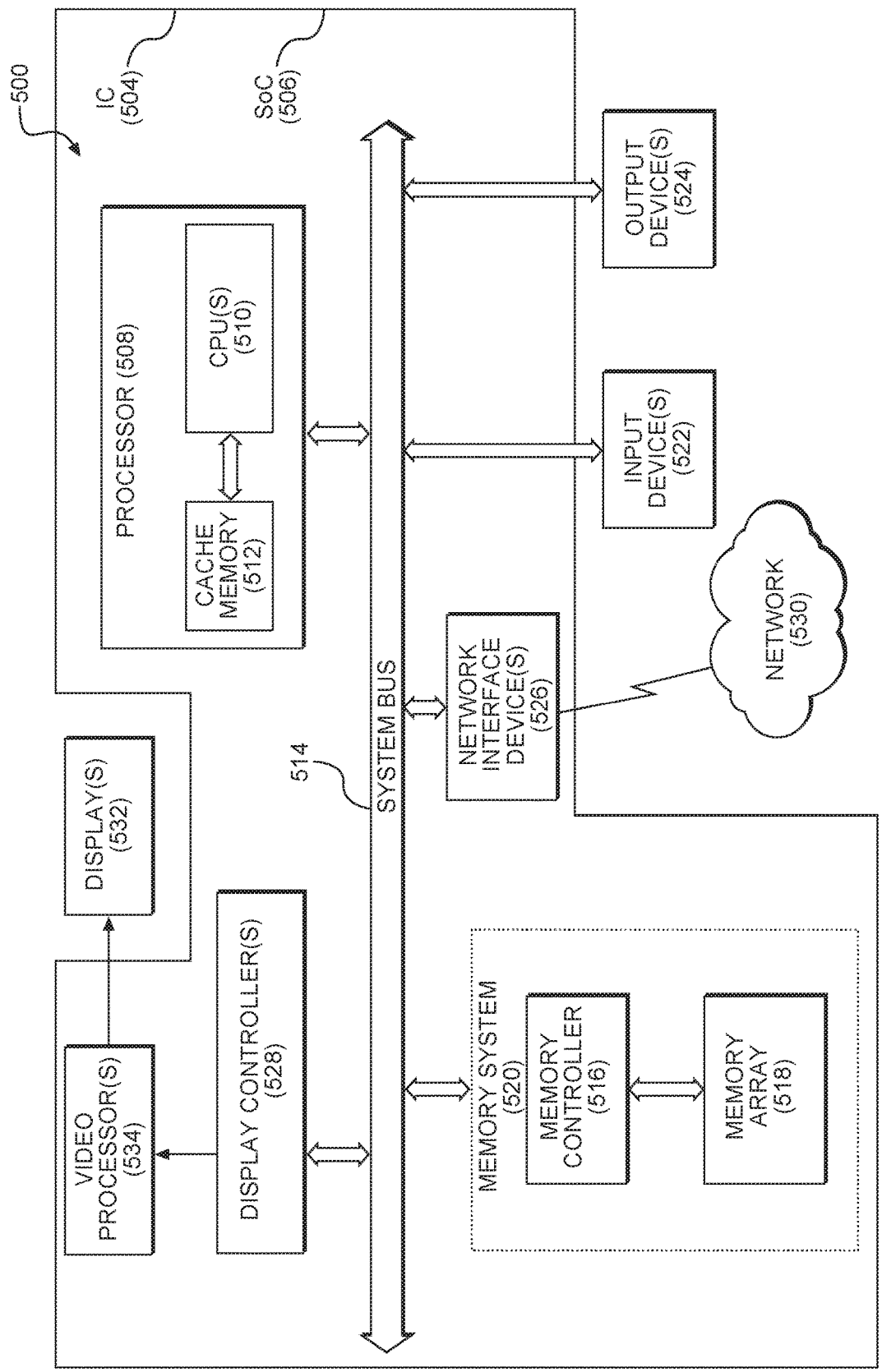
FIG. 5 is a block diagram of an exemplary processor-based system that can include an IC with an interconnect structure that includes a self-aligned via interconnected to a metal line among adjacent metal lines which have a metal line pitch and are asymmetric in width to dielectric structures disposed between the adjacent metal lines to reduce electrical resistance, wherein the dielectric structures include a plurality of gaps to avoid an increase in capacitive coupling between adjacent metal lines, such as the interconnect structure in FIGS. 2A and 2B and FIGS. 4N-1 and 4N-2.

In this regard, FIG. 5 illustrates an example of ICs having interconnect structures in which a via interconnects to a metal line among adjacent metal lines that have a metal line pitch and are asymmetric in width to dielectric structures disposed between the adjacent metal lines to reduce electrical resistance, and the dielectric structures include a plurality of gaps to avoid an increase in capacitive coupling as illustrated in FIGS. 2A-2B and 4N-1-4N-2, and according to any aspects disclosed herein. In this example, the processor-based system 500 may be formed as an IC 504 in a system-on-a-chip (SoC) 506. The processor-based system 500 includes a processor 508 that includes one or more central processor units (CPUs) 510, which may also be referred to as CPUs or processor cores. The processor 508 may have cache memory 512 coupled to the CPUs 510 for rapid access to temporarily stored data. As an example, the CPUs 510 could include ICs having a metal layer with asymmetric metal line-dielectric structures supporting self-aligned vias, wherein the dielectric structures each include a plurality of gaps between adjacent metal lines, including metal lines contacting a via structure, and according to any aspects disclosed herein. The processor 508 is coupled to a system bus 514 and can intercouple master and slave devices included in the processor-based system 500. As is well known, the processor 508 communicates with these other devices by exchanging address, control, and data information over the system bus 514. For example, the processor 508 can communicate bus transaction requests to a memory controller 516 as an example of a slave device. Although not illustrated in FIG. 5, multiple system buses 514 could be provided, wherein each system bus 514 constitutes a different fabric.

Other master and slave devices can be connected to the system bus 514. As illustrated in FIG. 5, these devices can include a memory system 520 that includes the memory controller 516 and a memory array(s) 518, one or more input devices 522, one or more output devices 524, one or more network interface devices 526, and one or more display controllers 528, as examples. Each of the memory system 520, the one or more input devices 522, the one or more output devices 524, the one or more network interface devices 526, and the one or more display controllers 528 can include interconnect structures in which a via interconnects to a metal line among adjacent metal lines that have a metal line pitch and are asymmetric in width to dielectric structures disposed between the adjacent metal lines to reduce electrical resistance, and the dielectric structures include a plurality of gaps to avoid an increase in capacitive coupling as illustrated in FIGS. 2A-2B and 4N-1-4N-2, and according to any aspects disclosed herein. The input device(s) 522 can include any type of input device, including, but not limited to, input keys, switches, voice processors, etc. The output device(s) 524 can include any type of output device, including, but not limited to, audio, video, other visual indicators, etc. The network interface device(s) 526 can be any device configured to allow exchange of data to and from a network 530. The network 530 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 526 can be configured to support any type of communications protocol desired.

The processor 508 may also be configured to access the display controller(s) 528 over the system bus 514 to control information sent to one or more displays 532. The display controller(s) 528 sends information to the display(s) 532 to be displayed via one or more video processors 534, which process the information to be displayed into a format suitable for the display(s) 532. The display(s) 532 can include any type of display, including, but not limited to, a cathode ray tube (CRT), a liquid crystal display (LCD), a plasma display, a light emitting diode (LED) display, etc. The display controller(s) 528, display(s) 532, and/or the video processor(s) 534 can include interconnect structures in which a via interconnects to a metal line among adjacent metal lines that have a metal line pitch and are asymmetric in width to dielectric structures disposed between the adjacent metal lines to reduce electrical resistance, and the dielectric structures include a plurality of gaps to avoid an increase in capacitive coupling as illustrated in FIGS. 2A-2B and 4N-1-4N-2, and according to any aspects disclosed herein.

Figure 6:
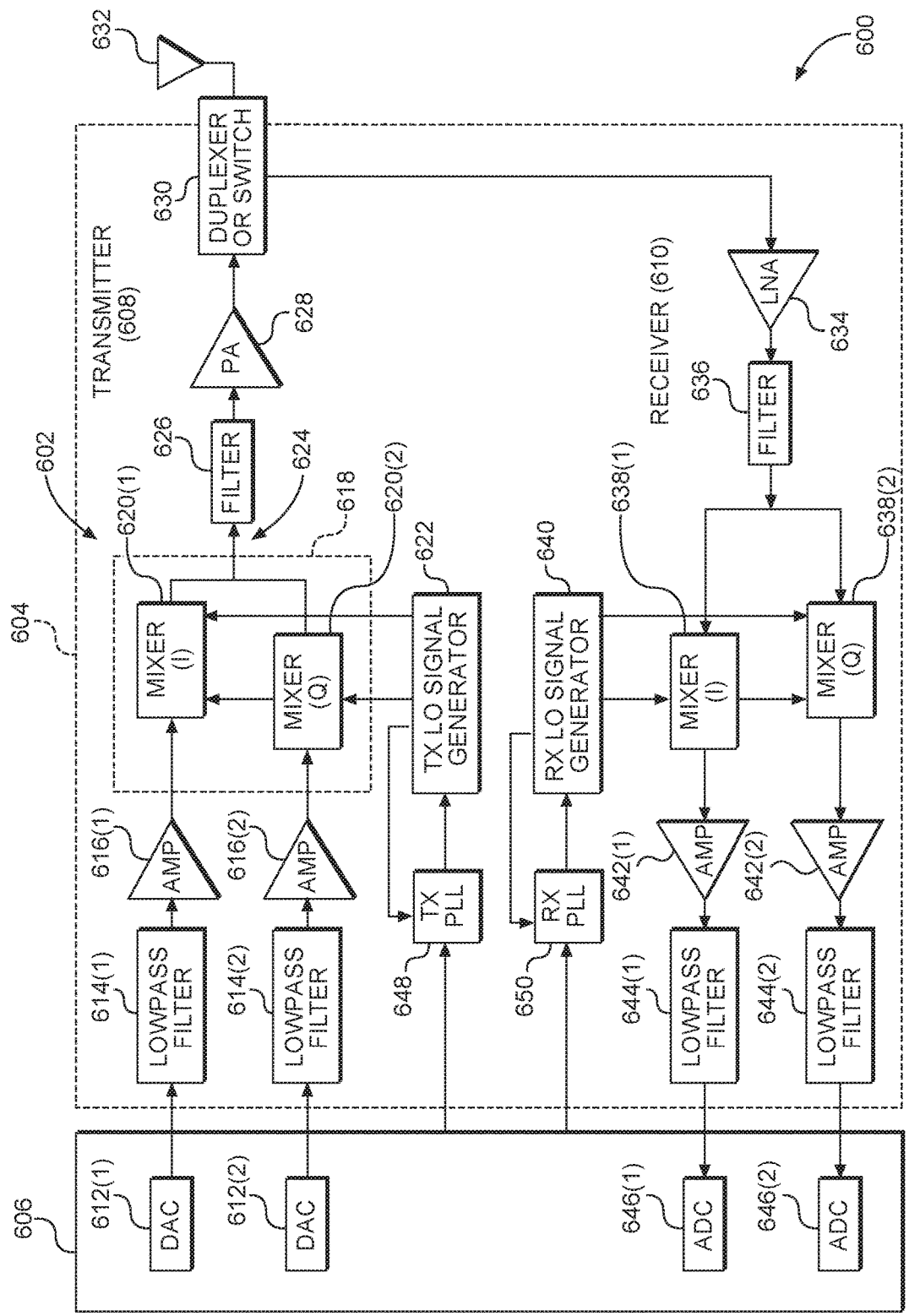
FIG. 6 is a block diagram of an exemplary wireless communications device that includes radio frequency (RF) components formed from an IC, wherein any of the components therein can include an IC with an interconnect structure that includes a self-aligned via interconnected to a metal line among adjacent metal lines, which have a metal line pitch and are asymmetric in width to dielectric structures disposed between the adjacent metal lines to reduce electrical resistance, wherein the dielectric structures include a plurality of gaps to avoid an increase in capacitive coupling between adjacent metal lines, such as the interconnect structures of FIGS. 2A and 2B and FIGS. 4N-1 and 4N-2.

FIG. 6 illustrates an exemplary wireless communications device 600 that includes radio frequency (RF) components formed from an IC 602, wherein any of the components therein can include interconnect structures in which a via interconnects to a metal line among adjacent metal lines that have a metal line pitch and are asymmetric in width to dielectric structures disposed between the adjacent metal lines to reduce electrical resistance, and the dielectric structures include a plurality of gaps to avoid an increase in capacitive coupling as illustrated in FIGS. 2A-2B and 4N-1-4N-2, and according to any aspects disclosed herein. The wireless communications device 600 may include or be provided in any of the above-referenced devices, as examples. As shown in FIG. 6, the wireless communications device 600 includes a transceiver 604 and a data processor 606. The data processor 606 may include a memory to store data and program codes. The transceiver 604 includes a transmitter 608 and a receiver 610 that support bi-directional communications. In general, the wireless communications device 600 may include any number of transmitters 608 and/or receivers 610 for any number of communication systems and frequency bands. All or a portion of the transceiver 604 may be implemented on one or more analog ICs, RF ICs (RFICs), mixed-signal ICs, etc.

The transmitter 608 or the receiver 610 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 610. In the direct-conversion architecture, a signal is frequency-converted between RF and baseband in one stage. The super-heterodyne and direct-conversion architectures may use different circuit blocks and/or have different requirements. In the wireless communications device 600 in FIG. 6, the transmitter 608 and the receiver 610 are implemented with the direct-conversion architecture.

In the transmit path, the data processor 606 processes data to be transmitted and provides I and Q analog output signals to the transmitter 608. In the exemplary wireless communications device 600, the data processor 606 includes digital-to-analog converters (DACs) 612(1), 612(2) for converting digital signals generated by the data processor 606 into the I and Q analog output signals, e.g., I and Q output currents, for further processing.

Within the transmitter 608, lowpass filters 614(1), 614(2) filter the I and Q analog output signals, respectively, to remove undesired signals caused by the prior digital-to-analog conversion. Amplifiers (AMPs) 616(1), 616(2) amplify the signals from the lowpass filters 614(1), 614(2), respectively, and provide I and Q baseband signals. An upconverter 618 upconverts the I and Q baseband signals with I and Q transmit (TX) local oscillator (LO) signals through mixers 620(1), 620(2) from a TX LO signal generator 622 to provide an upconverted signal 624. A filter 626 filters the upconverted signal 624 to remove undesired signals caused by the frequency upconversion as well as noise in a receive frequency band. A power amplifier (PA) 628 amplifies the upconverted signal 624 from the filter 626 to obtain the desired output power level and provides a transmitted RF signal. The transmitted RF signal is routed through a duplexer or switch 630 and transmitted via an antenna 632.

In the receive path, the antenna 632 receives signals transmitted by base stations and provides a received RF signal, which is routed through the duplexer or switch 630 and provided to a low noise amplifier (LNA) 634. The duplexer or switch 630 is designed to operate with a specific receive (RX)-to-TX duplexer frequency separation, such that RX signals are isolated from TX signals. The received RF signal is amplified by the LNA 634 and filtered by a filter 636 to obtain a desired RF input signal. Downconversion mixers 638(1), 638(2) mix the output of the filter 636 with I and Q RX LO signals (i.e., LO_I and LO_Q) from an RX LO signal generator 640 to generate I and Q baseband signals. The I and Q baseband signals are amplified by amplifiers (AMPs) 642(1), 642(2) and further filtered by lowpass filters 644(1), 644(2) to obtain I and Q analog input signals, which are provided to the data processor 606. In this example, the data processor 606 includes analog-to-digital converters (ADCs) 646(1), 646(2) for converting the analog input signals into digital signals to be further processed by the data processor 606.

In the wireless communications device 600 of FIG. 6, the TX LO signal generator 622 generates the I and Q TX LO signals used for frequency upconversion, while the RX LO signal generator 640 generates the I and Q RX LO signals used for frequency downconversion. Each LO signal is a periodic signal with a particular fundamental frequency. A TX phase-locked loop (PLL) circuit 648 receives timing information from the data processor 606 and generates a control signal used to adjust the frequency and/or phase of the TX LO signals from the TX LO signal generator 622. Similarly, an RX PLL circuit 650 receives timing information from the data processor 606 and generates a control signal used to adjust the frequency and/or phase of the RX LO signals from the RX LO signal generator 640.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but, is to be accorded the widest scope consistent with the principles and novel features disclosed herein.

What is claimed is:

1. An interconnect structure for an integrated circuit (IC), comprising:
   a metal layer comprising:
      a plurality of metal lines spaced apart at a metal line pitch in a first direction, each of the plurality of metal lines having a longitudinal axis extending in a second direction orthogonal to the first direction, and having a metal line width in the first direction; and
      a plurality of dielectric structures disposed between the plurality of metal lines, each of the plurality of dielectric structures disposed between adjacent metal lines and having a width in the first direction less than the metal line width, and each of the plurality of dielectric structures comprising a dielectric material having a plurality of gaps.

2. The interconnect structure of claim 1, wherein each dielectric structure of the plurality of dielectric structures further comprises:
   a plurality of slices of the dielectric material separated in the first direction by the plurality of gaps, the plurality of slices of the dielectric material extending lengthwise in the second direction.

3. The interconnect structure of claim 2, wherein the plurality of gaps are columnar between parallel slices of the dielectric material among the plurality of slices of the dielectric material.

4. The interconnect structure of claim 2, wherein each dielectric structure comprises openings to the plurality of gaps.

5. The interconnect structure of claim 4, wherein a top surface of each of the plurality of metal lines is recessed below a top surface of the dielectric structure.

6. The interconnect structure of claim 5, wherein each dielectric structure of the plurality of dielectric structures further comprises a cover layer to seal the openings of the plurality of gaps.

7. The interconnect structure of claim 6, wherein the plurality of gaps further comprise gaps filled with a gas having a lower k value than the dielectric material.

8. The interconnect structure of claim 7, wherein the gas comprises atmospheric air.

9. The interconnect structure of claim 6, wherein the plurality of gaps further comprise gaps filled with a fluid or solid having a lower k value than the dielectric material.

10. The interconnect structure of claim 6, further comprising:
   a dielectric layer disposed above the metal layer; and
   a vertical interconnect access (via) extending through the dielectric layer to contact a top surface of a destination metal line of the plurality of metal lines.

11. The interconnect structure of claim 10, wherein the via is a fully self-aligned via having a width wider than the metal line width such that a portion of the via extends closer in the first direction to an adjacent metal line of the plurality of metal lines than the destination metal line.

12. The interconnect structure of claim 11, wherein the portion of the via extending closer to the adjacent metal line is above the cover layer.

13. The interconnect structure of claim 11, wherein the via is self-aligned to a trench opening in the dielectric layer for an upper metal layer and to the top surface of the destination metal line recessed below the top surface of the dielectric structure.

14. The interconnect structure of claim 1 integrated in an IC.

15. The interconnect structure of claim 1, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

16. A method of forming an interconnect structure for an integrated circuit (IC), comprising:
   forming a metal layer comprising a plurality of metal lines disposed at a metal line pitch and a plurality of dielectric structures, wherein a width of the plurality of metal lines in a first direction is greater than a distance between adjacent metal lines of the plurality of metal lines in the first direction, the plurality of metal lines comprising top surfaces and the plurality of dielectric structures comprising top surfaces;
   disposing a protective coating on the top surfaces of the plurality of metal lines;
   disposing a block copolymer layer on the top surfaces of the plurality of dielectric structures;
   forming first type and second type phase separation structures in the block copolymer layer;
   etching the first type phase separation structures between the second type phase separation structures to expose portions of the top surfaces of the plurality of dielectric structures; and
   etching dielectric material of the plurality of dielectric structures below the exposed portions of the top surfaces of the plurality of dielectric structures, employing the second type phase separation structures as a mask to form slices of the dielectric material separated by gaps.

17. The method of claim 16, further comprising disposing an orientation control layer on side surfaces of the protective coating.

18. The method of claim 17, wherein disposing the orientation control layer on the side surfaces of the protective coating further comprises:

disposing a conformal orientation control layer over the top surfaces of the plurality of dielectric structures and on top and side surfaces of the protective coating; and removing the conformal orientation control layer from the top surfaces of the plurality of dielectric structures and the top surface of the protective coating by anistropic etching.

19. The method of claim 18, wherein the conformal orientation control layer has a thickness of approximately five (5) nanometers (nm).

20. The method of claim 17, wherein disposing the orientation control layer further comprises disposing a hydroxylated polystyrene-(random)-polymethylmethacrylate (PS-r-PMMA-OH) copolymer that is dissolved in an organic solvent.

21. The method of claim 17, wherein disposing the block copolymer layer comprises disposing a layer of one of polystyrene-block-polymethyl methacrylate (PS-b-PMMA), polystyrene-block-polybutadiene (PS-b-PB), and polystyrene-block-2-vinylpyridine (PS-b-P2VP).

22. The method of claim 16, wherein forming the first type and second type phase separation structures comprises annealing the block copolymer layer.

23. The method of claim 18, wherein etching the dielectric material further comprises etching away columnar portions of the dielectric material, forming the slices of the dielectric material parallel to each other.

24. The method of claim 23, further comprising:
removing the protective coating from the plurality of metal lines; and
etching the top surfaces of the plurality of metal lines to recess the top surfaces of the plurality of metal lines below the top surfaces of the plurality of dielectric structures.

25. The method of claim 24, further comprising:
removing the orientation control layer and the second type phase separation structures; and
disposing a cover layer on the top surfaces of the plurality of dielectric structures to seal openings of the gaps.

26. The method of claim 25, wherein disposing the cover layer on the top surfaces of the plurality of dielectric structures further comprises sealing the openings with air in the gaps.

27. The method of claim 25, further comprising:
disposing an etch stop layer on the metal layer;
disposing a dielectric layer on the etch stop layer;
etching the dielectric layer and the etch stop layer to form a vertical interconnect access (via) opening from a top surface of the dielectric layer to a top surface of a metal line of the plurality of metal lines; and
disposing metal in the via opening to form a self-aligned via in contact with the metal line.

28. The method of claim 27, wherein:
etching the dielectric layer further comprises forming a trench opening; and
disposing the metal in the via opening further comprises disposing metal in the trench opening to form an upper metal line coupled to the metal line by the self-aligned via.

29. The method of claim 28, further comprising disposing a diffusion barrier in the via opening and the trench opening in the dielectric layer.

30. The method of claim 29, further comprising disposing metal in the via opening and the trench opening via a dual damascene process.

* * * * *